US006707095B1

(12) United States Patent
Chidambarrao et al.

(10) Patent No.: US 6,707,095 B1
(45) Date of Patent: Mar. 16, 2004

(54) STRUCTURE AND METHOD FOR IMPROVED VERTICAL MOSFET DRAM CELL-TO-CELL ISOLATION

(75) Inventors: Dureseti Chidambarrao, Weston, CT (US); Jack A. Mandelman, Flat Rock, NC (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/290,400

(22) Filed: Nov. 6, 2002

(51) Int. Cl.[7] ............................................. H01L 27/108
(52) U.S. Cl. ...................... 257/302; 257/301; 257/300; 438/242
(58) Field of Search ................................ 257/302, 300, 257/301, 304, 305, 296; 438/242, 243, 250

(56) References Cited

U.S. PATENT DOCUMENTS

| | | | |
|---|---|---|---|
| 5,770,876 A | * | 6/1998 | Lam et al. .................... 257/301 |
| 6,018,174 A | | 1/2000 | Schrems et al. |
| 6,163,045 A | | 12/2000 | Mandelman et al. |
| 6,281,539 B1 | | 8/2001 | Mandelman et al. |
| 6,284,593 B1 | | 9/2001 | Mandelman et al. |
| 6,406,970 B1 | * | 6/2002 | Kudelka et al. ............ 438/386 |
| 6,440,793 B1 | | 8/2002 | Divakaruni et al. |
| 6,440,872 B1 | | 8/2002 | Mandelman et al. |
| 6,441,422 B1 | | 8/2002 | Mandelman et al. |
| 6,452,224 B1 | | 9/2002 | Mandelman et al. |

OTHER PUBLICATIONS

J. A. Mandelman et al., "Challenges and Future Directions for the Scaling of Dynamic Random–Access Memory (DRAM)", IBM J. Res. & Dev., vol. 46, No. 20, pp. 187–212 (Mar./May 2002).

* cited by examiner

Primary Examiner—David Nelms
Assistant Examiner—Thinh Nguyen
(74) Attorney, Agent, or Firm—Graham S. Jones; H. Daniel Schnurmann

(57) ABSTRACT

A method is provided for forming a vertical transistor memory cell structure with back-to-back FET cells which are formed in a planar semiconductor substrate with a plurality of deep trenches having vertical FET devices and a plurality of capacitors each located in a separate trench that is formed in the semiconductor substrate. Bilateral outdiffusion strap regions are formed extending into a doped semiconductor well region in the substrate. There are confronting pairs of outdiffusion strap regions extending from adjacent deep benches into the doped well region. An isolation diffusion region is formed in the doped well separating the confronting isolation diffusion regions by extending therebetween.

20 Claims, 19 Drawing Sheets

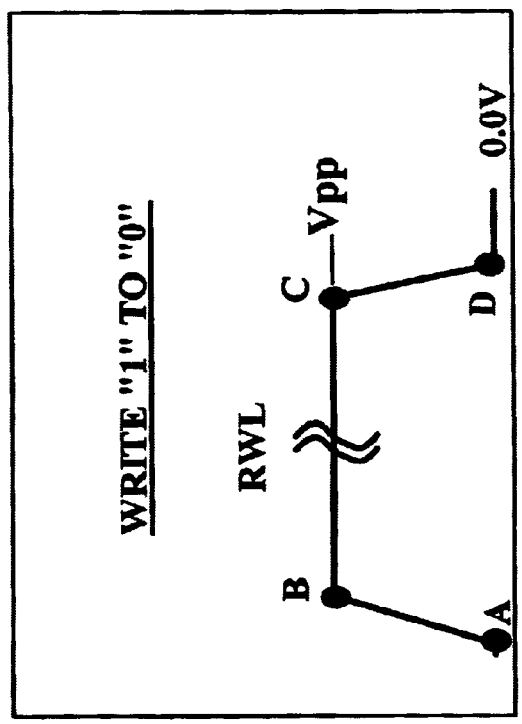
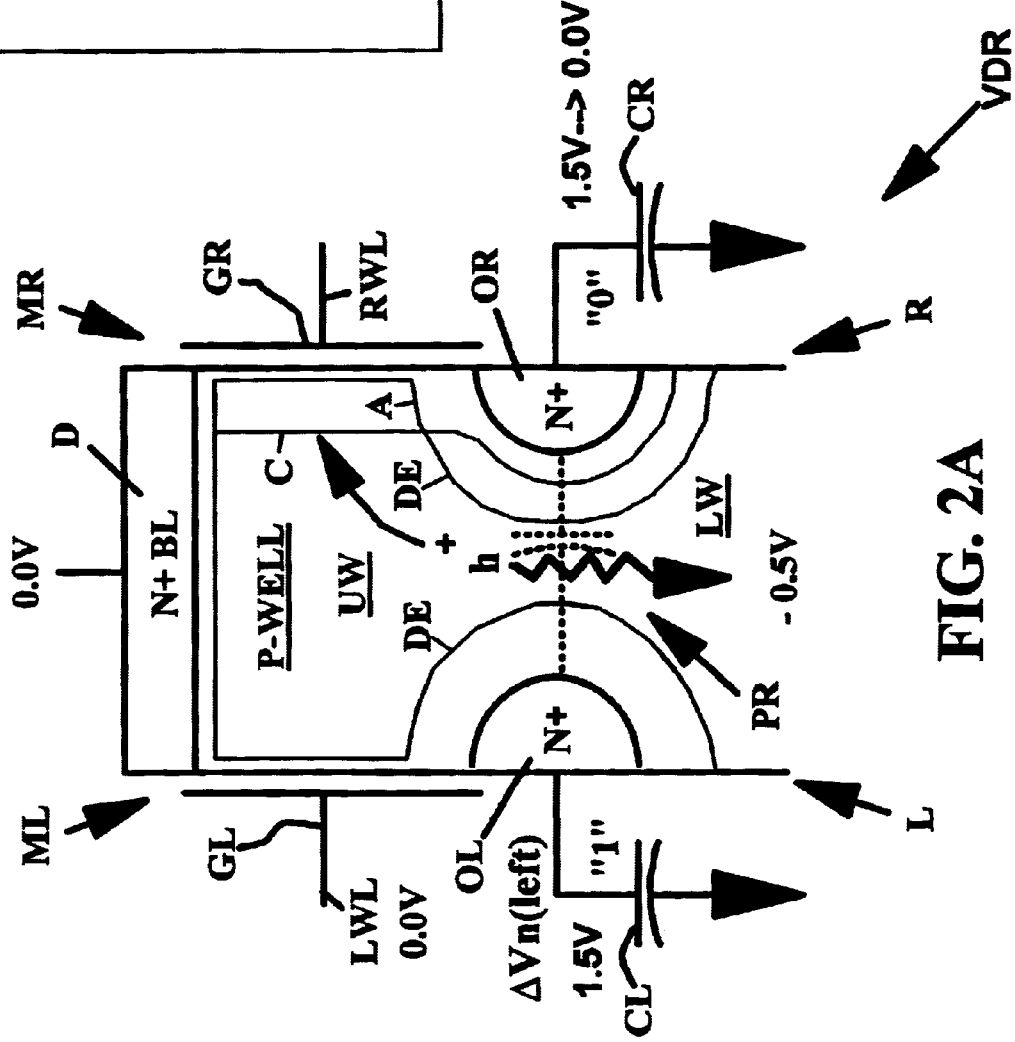
FIG. 2B
FIG. 2A

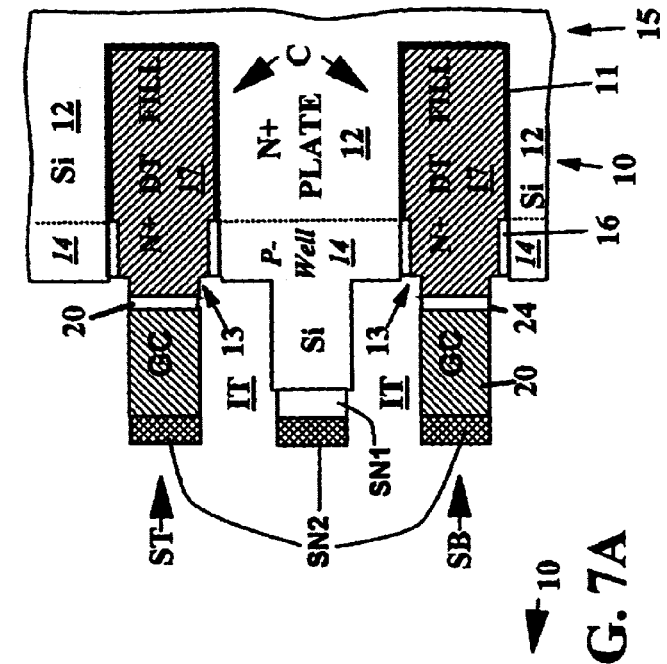
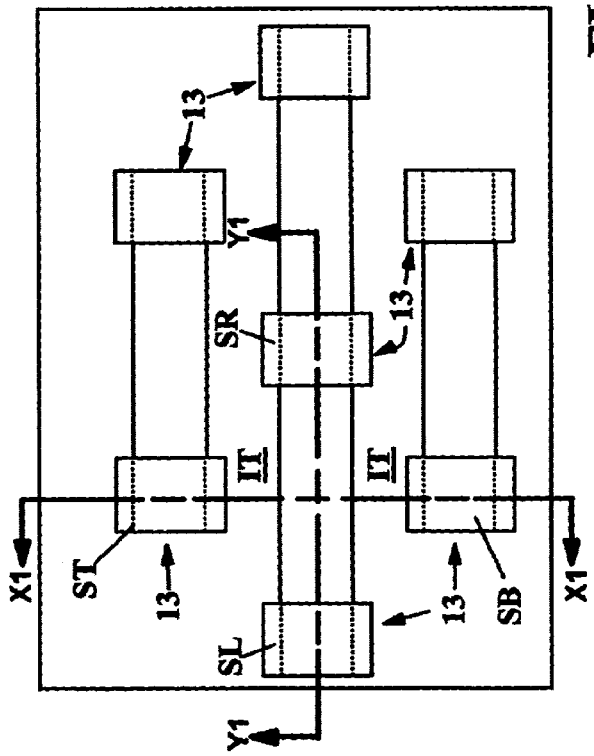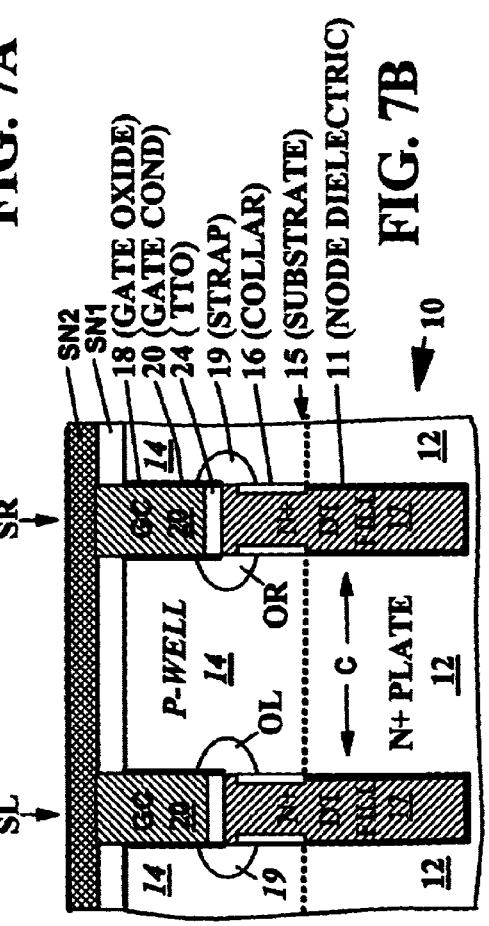

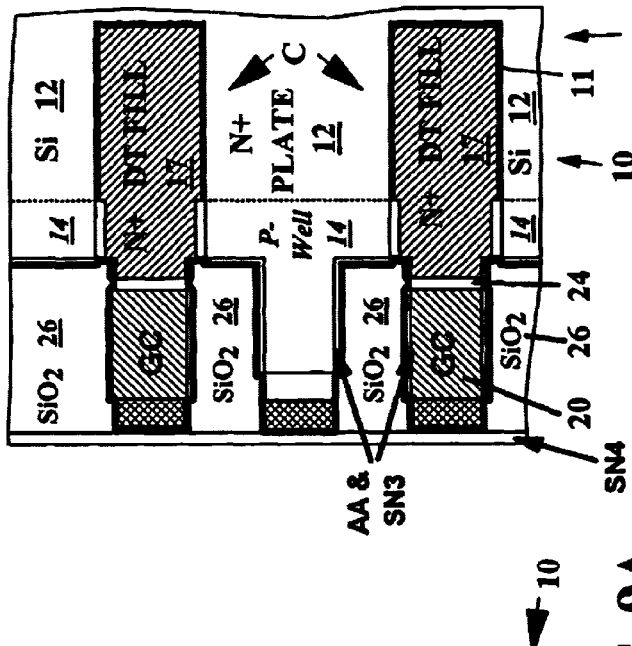
FIG. 9C
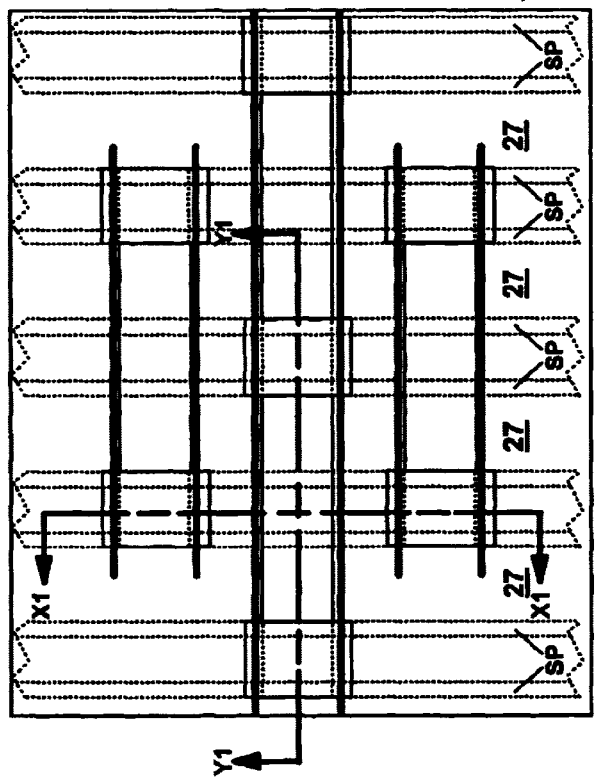
FIG. 9A
FIG. 9B

STRUCTURE AND METHOD FOR IMPROVED VERTICAL MOSFET DRAM CELL-TO-CELL ISOLATION

BACKGROUND OF THE INVENTION

1. Field of the Invention

This invention relates to methods of manufacturing semiconductor memory cells and more particularly to providing isolation between back-to-back MOSFET DRAM cells.

2. Description of Related Art

Present trends in Dynamic Random Access Memory (DRAM) technology are constantly driven towards reduction in minimum feature size "F", where the value "F" represents the minimum feature structural dimension of the memory cell. Also the trends for DRAM devices are towards more compact cell layouts, i.e., denser than 8 $F^2$, where the layout is the area required for a feature on the surface of the silicon substrate. Because of the need for ever increasing array densities, the scalability of contemporary planar metal oxide semiconductor field effect transistor (MOSFET) cells for smaller and smaller dimensions is facing fundamental concerns. The main concern with the scalability of the MOSFET cell is the increased P-well doping concentration needed to meet off-current objectives. It is well known in the art that increased array well doping concentration may result in a marked increase in array junction leakage, which degrades retention time. The problem of scalability related to the MOSFET cell, by itself, is driving the paradigm shift towards vertical MOSFET access transistors in the array.

There is a need for DRAM cells containing vertical access transistors with dense layouts and trench storage capacitors which yield sufficient capacitance and reduced series resistance to avoid degraded signal development.

Although some existing DRAM cells employing vertical MOSFETs offer very significant scalability advantages over conventional planar designs practiced today, there is still a great deal of room for improvement. For example, for cells using vertical MOSFETs and trench storage capacitors, a single bitline contact is commonly used to access a pair of bits; the pair of bits share a common silicon Active Area (AA). In this type of cell, dynamic coupling between the two back-to-back vertical MOSFETs results in charge pumping effects and loss of signal. Modeling has shown that electrons pumped into the P-well from a collapsing channel inversion layer of one cell may be collected by the storage node of the adjacent cell sharing the same AA. These coupling effects are accentuated as dimensions are scaled down. Modeling projections indicate that scalability to smaller and smaller dimensions will be problematic because of dynamic charge loss due to coupling between adjacent cell.

In addition to charge pumping problems, very dense prior art designs suffer from threshold voltage variations in the size of the silicon AA which occurs with overlay (alignment) errors between various masking levels and with dimensional variations of features formed by these masking levels.

Another problem faced with aggressively scaled DRAM cells is the increased aspect ratio (height to width) of the isolation regions. This is especially a concern with vertical MOSFETs in the array because of the requirement that the isolation trench be deep enough to cut the outdiffusion strap so as to prevent cell-to-cell leakage between straps. Typically, it is required that the isolation trench be at least 500 nm in depth to isolate the outdiffusion straps of the vertical MOSFETs. If the thickness of the pad layer is included, an isolation trench aspect ratio of 7:1 is anticipated by the 100 nm generation.

In view of the drawbacks mentioned hereinabove with prior art DRAM cell designs, there is a continued need to develop new and improved DRAM cell designs that are denser than prior art designs and have a larger DT size. A larger DT size is advantageous in dense DRAM cells since it provides a large storage capacitance and reduced series resistance to the array cell.

As indicated above, scaling of vertical MOSFET DRAM cells is limited by loss of data caused by dynamic coupling between back-to-back cells. For the existing structure and process, this mechanism may prevent the successful scaling of the 8 $F^2$ vertical MOSFET DRAM to 90 nm ground rules, where the value "F" represents the minimum feature size of the device, i.e. the dimension "F" is the minimum structural dimension of the memory cell.

U.S. Pat. No. 6,018,174 of Schrems et al. for "Bottle-Shaped Trench Capacitor with Epi Buried Layer" describes a bottle-shaped trench capacitor with an expanded lower trench portion and an epitaxial layer that is the buried plate of the trench capacitor. The patent states that "A conventional technique for forming the buried plate includes outdiffusing dopants into the substrate region surrounding the lower portion of the trench. One type of capacitor that is commonly employed in DRAMs is the trench capacitor. A trench capacitor is a three-dimensional structure formed in the substrate. Typically, a trench capacitor comprises a deep trench etched into the substrate. The trench is filled, for example, with n-type doped poly. The doped poly serves as one electrode of the capacitor (referred to as the "storage node"). An n-type doped region surrounds the lower portion of the trench, serving as a second electrode. The doped region is referred to as a "buried plate." A node dielectric separates the buried plate and the storage node.

U.S. Pat. No. 6,163,045 Mandelman et al. for "Reduced Parasitic Leakage in Semiconductor Devices" describes a trench capacitor having a diffusion region adjacent to the collar to increase the gate threshold voltage of the parasitic MOSFET enabling the use of a thinner collar while still achieving an acceptable level of leakage. The patent states that "Trench capacitors are commonly employed in DRAMs. A trench capacitor is a three-dimensional structure formed into the silicon substrate. A conventional trench capacitor comprises a trench etched into the substrate. The trench is typically filled with n+ doped poly which serves as one plate of the capacitor (referred to as the storage node). The second plate of the capacitor, referred to as a 'buried plate,' is formed by, for example, outdiffusing n+ dopants from a dopant source into a region of the substrate surrounding the lower portion of the trench. A dielectric layer is provided to separate the two plates forming the capacitor. To prevent or reduce parasitic leakage that occurs along the upper portion of the trench to an acceptable level, an oxide collar of sufficient thickness is provided therein." The patent states further that "p-type dopants, such as boron (B) are implanted into the well region. The dopants are implanted sufficiently deep to prevent punchthrough and to reduce sheet resistance. The dopant profile is tailored to achieve the desired electrical characteristics, e.g., gate threshold voltage ($V_T$)". The device includes an arrangement referred to here as Bilateral BSOD (BBSOD) configuration, i.e. there are buried strap outdiffusion regions on both sides of the deep trench of the device, but it should be noted that there is only one isolated deep trench device shown in the device, so there is no showing of BSOD regions in a confrontational configuration in a P-well.

Commonly assigned U.S. Pat. No. 6,281,539 of Mandelman et al. for "Structure and Process for 6 $F^2$ DT Cell Having Vertical MOSFET and Large Storage Capacitance" describes a 6 $F^2$ memory cell comprising a plurality of capacitors each located in a separate trench that is formed in a semiconductor substrate. Each of a plurality of transfer transistors has a vertical gate dielectric, a gate conductor, and a bitline diffusion, and each transistor is located above and electrically connected to a respective trench capacitor. About the transistors are dielectric-filled isolation trenches spaced apart by a substantially uniform spacing in a striped pattern. A respective wordline is electrically contacted to each respective gate conductor.

The above Mandelman et al. U.S. Pat. No. 6,281,539 states as follows "To prevent unwanted formation of strap diffusion on the side of the trench which is adjacent to the oxide fill, a thin $Si_3N_4$ barrier layer (i.e., about 1 nm or less) may be formed prior to the deposition of the strap polysilicon. For simplicity, this barrier layer is not shown in the drawings of the present invention. The barrier nitride impedes the diffusion of dopant from the N+ DT poly into the substrate during gate oxidation. Later thermal processing breaks down this barrier layer, allowing the strap to outdiffuse on the desired side of the trench. Other options that may be employed in the present invention to impede unwanted strap outdiffusion include, but are not limited to: low temperature gate oxidation and isotropic etching of a small amount of substrate on the trench sidewall."

Commonly assigned U.S. Pat. No. 6,284,593 of Mandelman et al. for "Method for Shallow Trench Isolated, Contacted Well, Vertical MOSFET DRAM" describes a floating-well dynamic leakage mechanism that limits scalability of vertical DRAM memory arrays. Specifically, during a long period of about 5–100 ns of repeated writing of a "1" to other memory cells on the bitline, the P-well of an unselected cell storing a "1" may suffer from leakage, as the exiting of holes is restricted by a parasitic JFET. The patent states that "Leakage depends on the degree of well isolation caused by pinchoff from expansion of the storage node depletion region. In an extreme case, the buried-strap region may come in contact with the adjacent deep trench capacitor. Moreover, the hole current through the pinchoff region must keep up with the leakage to avoid a pseudo 'Floating-Body Effect'".

The above Mandelman et al. U.S. Pat. No. 6,284,593 states further that "For aggressively scaled metal oxide semiconductor field effect transistors (MOSFETs) in prior art vertical DRAM memory cells, the depletion region from the storage node diffusion (i.e., buried-strap outdiffusion) encroaches upon the sidewall of the adjacent storage trench, which results in dynamic charge loss from the storage capacitor as the bitline of an unselected device is cycled. This charge loss mechanism is identical to that published in 'Floating-Body Concerns for SOI Dynamic Random Access Memory (DRAM)', Proceeding, 1996 IEEE International SOI Conference, Jack Mandelman, et al. pp. 1367–137, October 1996."

Commonly assigned U.S. Pat. No. 6,440,872 of Mandelan et al. for "Method for Hybrid DRAM Cell Utilizing Confined Strap Isolation" which has a similar description to U.S. Pat. No. 6,284,593 describes forming a planarized layer of oxide in etched arms on an oxide/nitride liner so as to form shallow isolation trench regions which have a depth that is substantially above a buried-strap outdiffusion region to be subsequently for thereby not cutting into a BSOD region, yet being deep enough for isolation of adjacent bitline diffusion regions that are subsequently formed, but it does not relate to isolation of outdiffusion regions.

Commonly assigned U.S. Pat. No. 6,441,422 of Mandelman et al. for "Structure and Method for Ultra-scalable Hybrid DRAM Cell with Contacted P-Well" is similar to U.S. Pat. Nos. 6,440,872 and 6,284,593 discussed above.

Commonly assigned U.S. Pat. No. 6,440,793 Divakaruni et al. for "Vertical MOSFET" describes a process for making a vertical MOSFET DRAM cell array with a deposited gate conductor layer planarized to a top surface of a trench top oxide and a silicon substrate. Then form a recess in the gate conductor layer below the top surface of the silicon substrate. Next, angle implant N-type dopant through the recess to form doping pockets in an array P-well. An oxide layer is deposited into the recess. The oxide layer is etched to form spacers on sidewalls of the recess. A gate conductor material is deposited into the recess and the gate conductor is planarized to the top surface of the trench top oxide. There is a unilateral BSOD, i.e. there is a strap on only one side of the deep trench.

All of the above patents include unilateral Buried Strap OutDiffusions (BSOD's), i.e. there is a strap on only one side of the deep trenches shown. We have discovered these shortcomings and decided to pursue the bilateral (8 $F^2$) cell approach because the design with the unilateral (single) strap suffers from a host of scalability problems, which are different from and more severe than the scalability problems of the cell with the bilateral straps.

SUMMARY OF THE INVENTION

An object of this invention is to provide an improved way to suppress the loss of a stored "1" due to the dynamic loss mechanism, as described above.

It is a further object of this invention to provide a simple, cost effective, method for forming the improved structure, thereby significantly extending the scalability of 8 $F^2$ vertical MOSFET DRAM arrays.

In summary, the present invention provides the following advantages over the existing art:

1. Allows scaling of 8 $F^2$ vertical MOSFET DRAM cells to 90 nm and beyond;
2. Allows reduction in array P-well doping concentration adjacent to back-to-back cells (i.e. Confronting Buried Strap OutDiffusions (BSOD's)), for reduced junction leakage and improved retention time.

In accordance with the method of the present invention, a structure is formed which has significantly improved immunity to cell-to-cell interaction.

Further in accordance with the method of this present invention, a locally enhanced P-well doping region is formed between back-to-back cells, without significantly affecting the doping concentration at the strap diffusion junctions.

Moreover, the method of this invention contains the localized doping concentration to the mid-region between back-to-back cell sites, without significantly affecting the Vt of the vertical MOSFETs, and without degrading the substrate sensitivity.

Additionally the method of this invention can be readily integrated into an existing process at minimal cost.

In accordance with this invention, a method is provided for forming a vertical transistor memory cell structure with back-to-back FET cells formed in a planar semiconductor substrate with a plurality of deep trenches having vertical FET devices and a plurality of capacitors each located in a separate trench that is formed in the semiconductor substrate; with outdiffusion strap regions (which can be bilateral) formed extending from the trenches into a doped semiconductor region and with adjacent deep trenches having confronting pairs of outdiffusion regions extending from adjacent deep trenches into the doped semiconductor region. The method includes the step of forming an isolation diffusion region in the substrate between the back-to-back cells separating the confronting outdiffusion strap regions so that the fields surrounding the outdiffusion/strap regions are separated by the isolation diffusion region.

Preferably, before forming the isolation diffusion region, the steps are performed of forming an isolation trench masking layer with openings between rows of deep trenches, and then etching through the openings in the isolation trench masking layer to form isolation trenches between rows of deep trenches.

Preferably, before forming the isolation diffusion region, the step is performed of forming a parallel array of active area liners composed of silicon oxide, followed by depositing a conformal first silicon nitride liner on the sidewalls of the isolation trenches thereby narrowing the isolation trenches and above other surfaces of the structure.

Preferably, before forming the isolation diffusion region, the steps are performed of filling the isolation trenches with sacrificial silicon oxide, planarizing the sacrificial silicon oxide, and forming a blanket silicon nitride layer over the structure forming a silicon oxide masking layer over the blanket silicon nitride layer, and etching a parallel array of shallow trenches through the silicon oxide masking layer, thereby forming silicon oxide stripes orthogonal to the active area stripes by etching through the silicon oxide masking layer.

Preferably, before forming the isolation diffusion region the step is performed of doping the diffusion isolation regions between the deep trenches.

Preferably, before forming the isolation diffusion region, the steps are performed of forming spacers on the sidewalls of the parallel array of shallow trenches thereby forming narrowed shallow trenches, forming windows to a diffusion isolation regions in the substrate and to the gate conductors and by etching through the narrowed shallow trenches, stripping the silicon oxide masking layer and the spacers, and doping the diffusion isolation regions through the widows.

Preferably, before forming the isolation diffusion region, the steps are performed of forming a blanket silicon nitride protective layer and forming a planarized silicon oxide layer thereover.

In accordance with another aspect of this invention, a method is provided for forming a vertical transistor memory cell structure with back-to-back FET cells formed in a planar semiconductor substrate with a doped plate region in the substrate below a counterdoped well region, deep trenches formed therein extending into the substrate through the well region and into the plate region. Each deep trench has side walls and a bottom with bilateral outdiffusion strap regions which extend from the deep trenches, located in the well region midway up the sidewalls of the deep trenches. The outdiffusion strap regions and a plate region formed in the substrate from lower levels of the deep trench to below the deep trenches. A collar is formed along middle levels of the sidewalls of the deep trench from a lower portion of the strap regions down towards the plate region of the substrate and a node dielectric covering lower sidewalls and the bottom of the deep trenches. The deep trenches have capacitor nodes formed in the bottoms thereof. Trench top dielectric layers are formed above the capacitor nodes. A gate oxide layer is formed on the sidewalls of the deep trench above the capacitor nodes and a gate conductor is formed above the trench top dielectric layer and inside the gate oxide layer in the deep trenches. The memory structure is made by including the step of forming an isolation diffusion region in the substrate between the back-to-back cells separating the confronting the outdiffusion strap regions so that the fields surrounding the outdiffusion/strap regions are separated by the isolation diffusion region.

BRIEF DESCRIPTION OF THE DRAWINGS

The foregoing and other aspects and advantages of this invention are explained and described below with reference to accompanying drawings, wherein:

FIG. 2A depicts a hypothetical vertical MOSFET DRAM army of back-to-back vertical transistors with confronting bilateral BSOD regions.

FIG. 2B is a chart showing how a "1" has been rewritten to a 37 0" in the device of FIG. 2A thereby contributing to the generation of an error.

FIGS. 7A–7C show an intermediate stage of formation of a vertical, N-channel, MOSFET device with back-to-back deep trench sites with bilateral BSOD regions in accordance with this invention.

FIGS. 9A and 9B show the device of FIGS. 8A–8C after depositing an isolation trench insulator into the isolation trenches, planarizing the isolation trench insulator, depositing a silicon nitride etch stop layer, forming silicon oxide stripes, and forming silicon oxide spacers alongside the silicon oxide stripes.

DESCRIPTION OF THE INVENTION

Problem Solved by Invention

It is fundamental to data storage integrity that when one of the cells of a DRAM device has been exercised repeatedly with a write "1"-write "0" pattern; data integrity in other cells of the DRAM device must be ensured. However we have found that in vertical FET devices with confronting Buried Strap OutDiffusion (BSOD) regions (especially bilateral BSOD configurations), the risk of loss of data is a problem which must be solved. The need for a solution to the problem is indicated on pages 198–202 of J. A. Mandelman et al. "Challenges and Future Directions for the Scaling of Dynamic Random-Access Memory (DRAM), IBM J. RES. & DEV., VOL. 46, NO. 20. pp. 187–212 (MARCH/MAY 2002).

Figure 1:
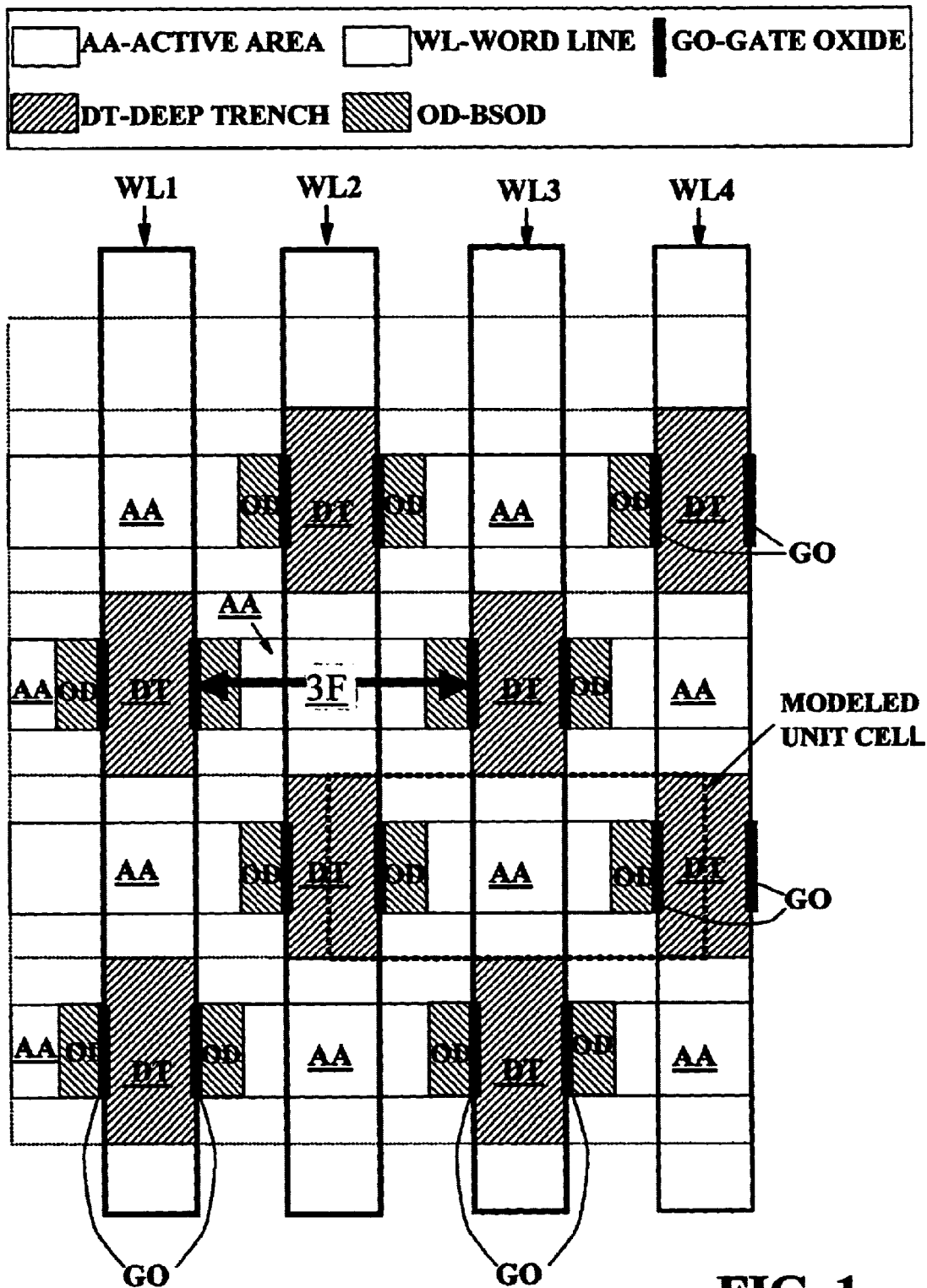
FIG. 1 shows a layout of a portion of a hypothetical 8 $F^2$ vertical MOSFET DRAM with back-to-back vertical transistors which include BSOD regions.

To illustrate the context of the problem of such vertical MOSFET DRAM devices, FIG. 1 shows a layout of some components of a portion of a hypothetical 8 $F^2$ vertical MOSFET DRAM array of back-to-back vertical transistors. FIG. 1 shows buried features and surface features in different planes as being coplanar, for purposes of elucidation, to indicate relative locations of various elements of the DRAM array in a silicon semiconductor substrate. FIG. 1 shows several bilateral BSOD regions OD (hatched), active areas AA (shaded gray), deep trenches DT (reverse hatched), gate oxide layers GO (dark stripes), and wordlines WL1–WL4. The word lines WL1–WL4 are located directly above four gate conductors which are not shown. FIG. 1 also shows a very small modeled cell unit in the dotted region. Aspects of the problem with such very small cell units caused by the ever shrinking dimensions of semiconductor devices in the MOSFET technology is described below.

Static Leakage

As the distance between back-to-back cells with confronting BSOD regions decrease, the problem of leakage current between the confronting BSOD regions due to lowering of the potential barrier becomes a concern. This problem is a manifestation of the Drain-Induced Barrier-Lowering (DIBL) mechanism caused by penetration of the electric field, which is a well known phenomenon in MOSFETs. A dynamic data retention problem is inherent in the 8 $F^2$ vertical MOSFET DRAM layout of FIG. 1, which manifests itself as minimization of feature dimensions seemingly inexorably progresses to smaller and smaller dimensions.

FIG. 2A illustrates the problem solved by this invention by depicting a hypothetical vertical MOSFET DRAM device VDR which includes two vertical deep trench transistors ML and MR with BSOD regions OL/OR arranged in a back-to-back configuration. The two vertical transistors ML and MR are components of a left hand cell L and a right hand cell R Left hand cell L includes FET transistor ML, deep trench capacitor CL, and BSOD region OL that extends into the left side of a P-well. A gate electrode GL of the FET ML is connected to a left wordline LWL. Storage capacitor CL of cell L is connected between the left BSOD region OL and ground (reference potential). It is desired to hold a "1" (1.5V) level for a relatively long period of time, on the left-band storage capacitor CL.

Right hand cell R includes FET transistor MR, deep trench capacitor CR, and BSOD region OR extending into the right side of the P-well Gate electrode GR of the FET MR is connected to right wordline RWL. The adjacent storage capacitor CR of cell R is connected between the right BSOD region OR and ground. The problem dealt with by this invention is created when the "transient" voltage across the adjacent storage capacitor CR cycles between 0V and 1.5V repeatedly over a very short period of time.

The nodes of the capacitors CL and CR are formed in the bottoms of the deep trenches which include deep trench cells L and R. BSOD regions OL/OR, which are formed on the exterior sidewalls of the trenches, are located on opposite sides of the P-well confronting each other. The P-well includes a lower well LW, an upper well UW and a narrow pinched region PR (which joins the lower well LW and the upper well UW) between BSOD regions OL/OR. The two FETs ML/MR have a common drain D formed in the P-well (which is N+ doped) that serves as the bitline BL input connection to the device VDR. The FETs ML/MR include N+ doped source regions provided by the BSOD regions OL/OR. Channels of the two FETs ML/MR are located between the BSOD regions OL/OR and drain D as will be well understood by those skilled in the art.

The modeled geometry and approximate location of depletion region edges of back-to-back vertical left MOSFET cell ML and right MOSFET cell MR of the device VDR shown in FIG. 2A has the problem of loss of data. To the first order, the extent of the barrier lowering is a function of as follows:

(1) the P-well doping concentration between the confronting N+ doped BSOD regions OL/OR;
(2) the distance between metallurgical junctions;
(3) the highest P-well concentration; and
(4) smallest size BSOD regions, are desired.

For example, a "1" that is stored in capacitor CL and which is intended to remain stored in the capacitor CL may be lost due to unwanted discharge over time.

The cause of such a loss of data is a static leakage mechanism which results in an adjacent high level stored "1" in capacitor CL and a low level "0" in capacitor CR is the leaking of charge via the BSOD's OL/OR and the pinched region PR, thereby resulting in degradation of the signal margin. The risk loss of data, in that fashion, is a serious problem since it was intended that a stored "1" should remain stored in capacitor CL of cell L for a prolonged period of time regardless of what activity occurs in right cell R, including FET MR, BSOD OR, and/or capacitor CR. For example, in FIG. 2A the problem of loss of data can occur when there is dynamic loss of a stored "1" from a left hand cell L at 1.5V across capacitor CL due to repeated cycling of the right hand cell R which is shown after it has dropped from 1.5V to 0.0V across capacitor CR. Although loss of charge from a stored "1" may be less than a tenth of a microvolt per cycle, there may be an inability to detect the "1" since $10^6$ to $10^7$ wordline cycles may have expired before the data is refreshed.

Dynamic Leakage

Another potential problem in scaling a deep trench vertical transistor, a DRAM cell of this type to smaller dimensions is a dynamic leakage mechanism for a stored "1" in cell L, when the bitline BL and the wordline RWL of the adjacent right cell R are cycled in the course of data read, write, and refresh operations. As the adjacent right cell R is cycled, the distribution of majority carriers (i.e., holes) in the P-well region between the two opposed vertical gates GL and GR is modulated by the time-varying electric field. Majority carriers must be able to flow freely between the gates GL and GR in the upper well UW well through the pinched region PR and into the lower well region LW below the BSOD regions OL/OR to maintain charge equilibration in the P-well. The undepleted region between the two back-to-back BSOD regions OL/OR narrows as the spacing between storage trenches in two back-to-back cells L/R is reduced (narrowing pinched region PR) thus impeding the flow of holes and pumping the voltage on the P-well between the gates GL/GR as the wordline RWL is cycled.

The data stored on the right hand capacitor CR is repeatedly cycled between a "1" and a "0". Because of the dynamic punchthrough effect, there is a negative incremental decrease in the voltage on the left storage capacitor CL as a function of the cycling of the voltage on the right hand strap outdiffusion OR.

The cause of this problem of dynamic leakage is shrinkage of the ground rules (minimum feature size, F). As F shrinks the cross-sectional area between adjacent depletion regions associated with the buried strap outdiffussions OL/OR decreases in a pinched region PR therebetween. The reduced cross-sectional area in the pinched region PR impedes the flow of holes $h^+$ between the upper well region UW and lower well region LW in the P-well, as indicated by the jagged arrow pointing downwardly in FIG. 2A. In other words, the upper well region UW and lower well region LW are partially decoupled due to the impedance of the pinched region PR between the adjacent strap outdiffusions OL/OR.

FIG. 2B is a chart showing how a "1" has been rewritten to a "0" thereby contributing to the generation of an error. First the "1" is written as shown by the rise of the trace from "0" at A to "1" at B in response to a signal from the right word line RWL. After an interval indicated by the broken line the voltage Vpp at point C drops to 0.0 Volts at point D showing that the "1" has been rewritten to a "0", contributing incrementally to the generation of an error.

There is capacitive "upcoupling" of the upper well region UW caused by the rising voltage on the right-hand wordline RWL. The term "upcoupling" as used here means that the rising wordline voltage capacitively couples to the upper region of the P-well, raising the potential of the upper portion of the P-well, and lowering the energy barrier for electrons traversing from strap-to-strap. Moreover, the electron barrier between adjacent strap outdiffusions OL/OR is lowered further by a downward transition of the right hand strap outdiffusion OR. The dynamic punchthrough between the BSOD regions OL/OR leads to the result that the incremental voltage change ($\Delta$ Vn (left)) is net negative. The effect is accentuated with deceased trench-to-trench spacing, increased strap outdiffusion, and decreased P-well doping between strap outdiffusions OL/OR.

Figure 3:
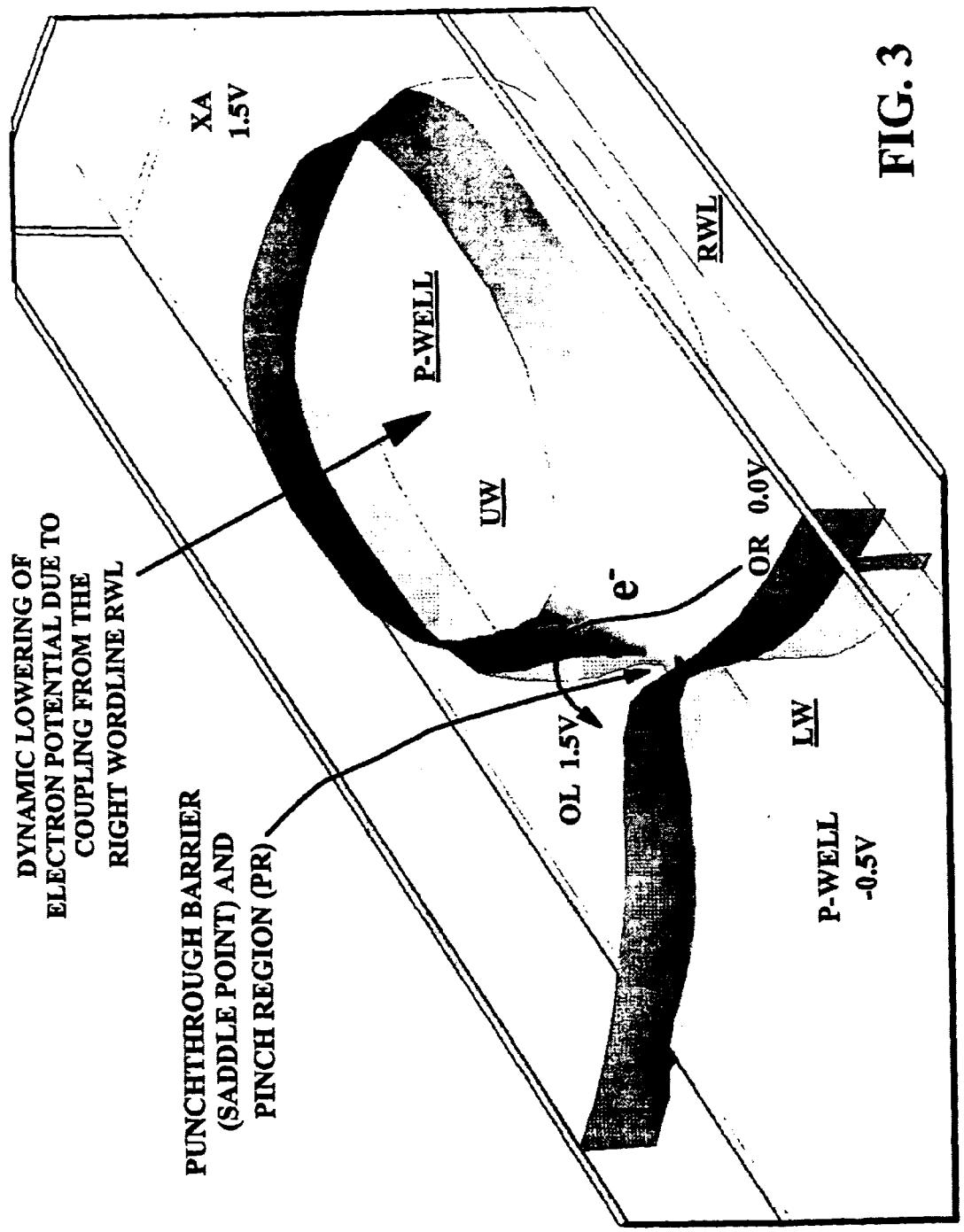
FIG. 3 shows a perspective view of a simulated surface of constant electron potential for the device of FIG. 2A.

FIG. 3 shows a perspective view of a simulated surface of constant electron potential for the device of FIG. 2A, showing dynamic lowering of the punchthrough barrier (saddle point) between BSOD regions OL/OR, due to modulation of the potential of the upper well UW in the P-well by the rising potential of the right hand wordline RWL. Thus, when the data an the right hand FET MR cycles, the decoupling effect between upper well region UW and lower well region LW in the P-well allows the potential of upper well region UW to be modulated by coupling to the cycling voltage on both right hand wordline RWL and right hand storage node across right hand storage capacitor CR. Exhaustive simulations have shown that the dominant mechanism for the loss of a stored "1" from the left hand storage capacitor CL is due to a dynamic lowering of the electron potential barrier between adjacent (back-to-back) BSOD regions OL/OR, as indicated by FIG. 3.

Figure 4:
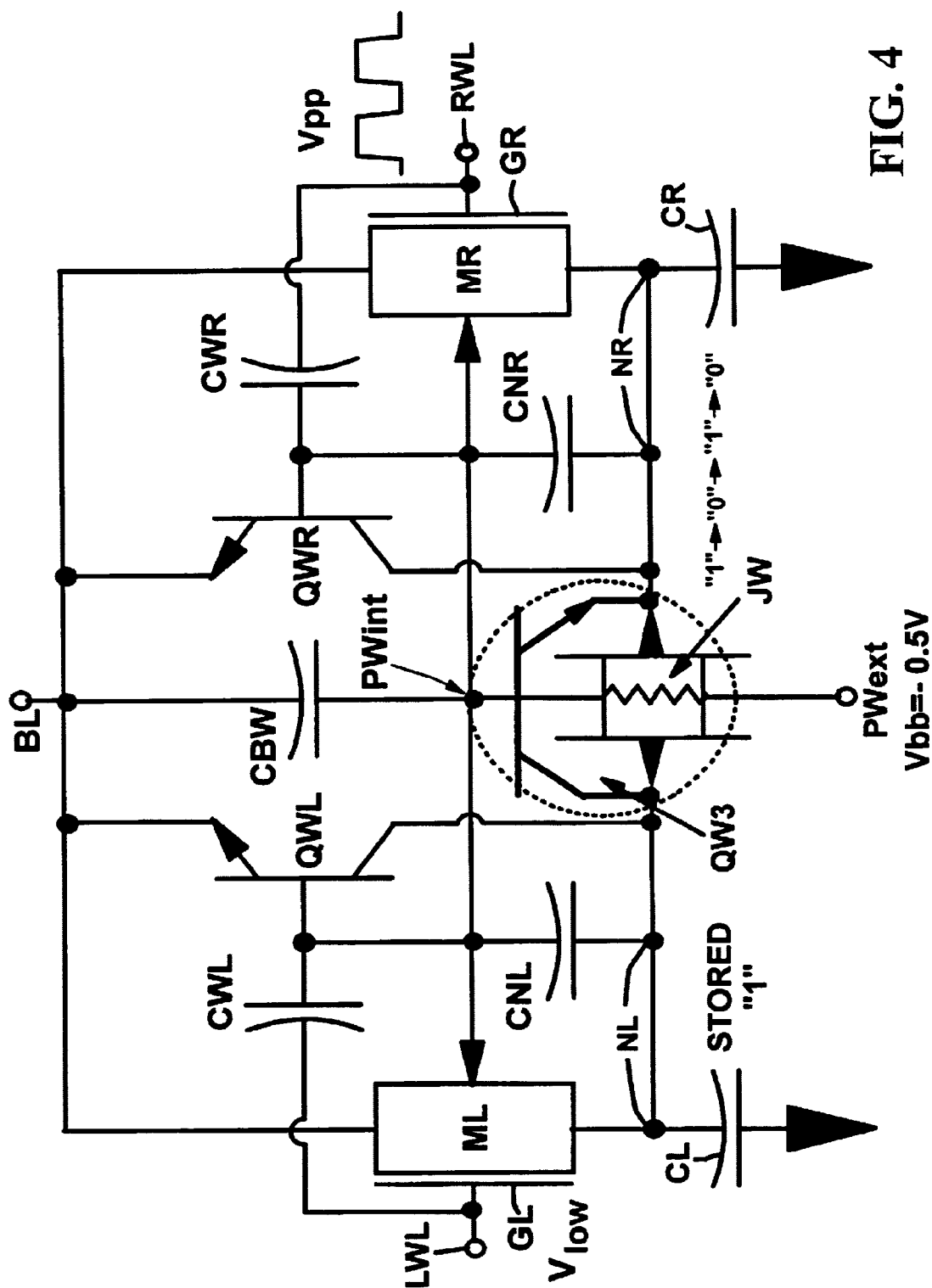
FIG. 4 shows an equivalent circuit representation of back-to-back vertical MOSFET DRAM cells in accordance with FIGS. 2A and 3, including parasitics.
Figure 5:
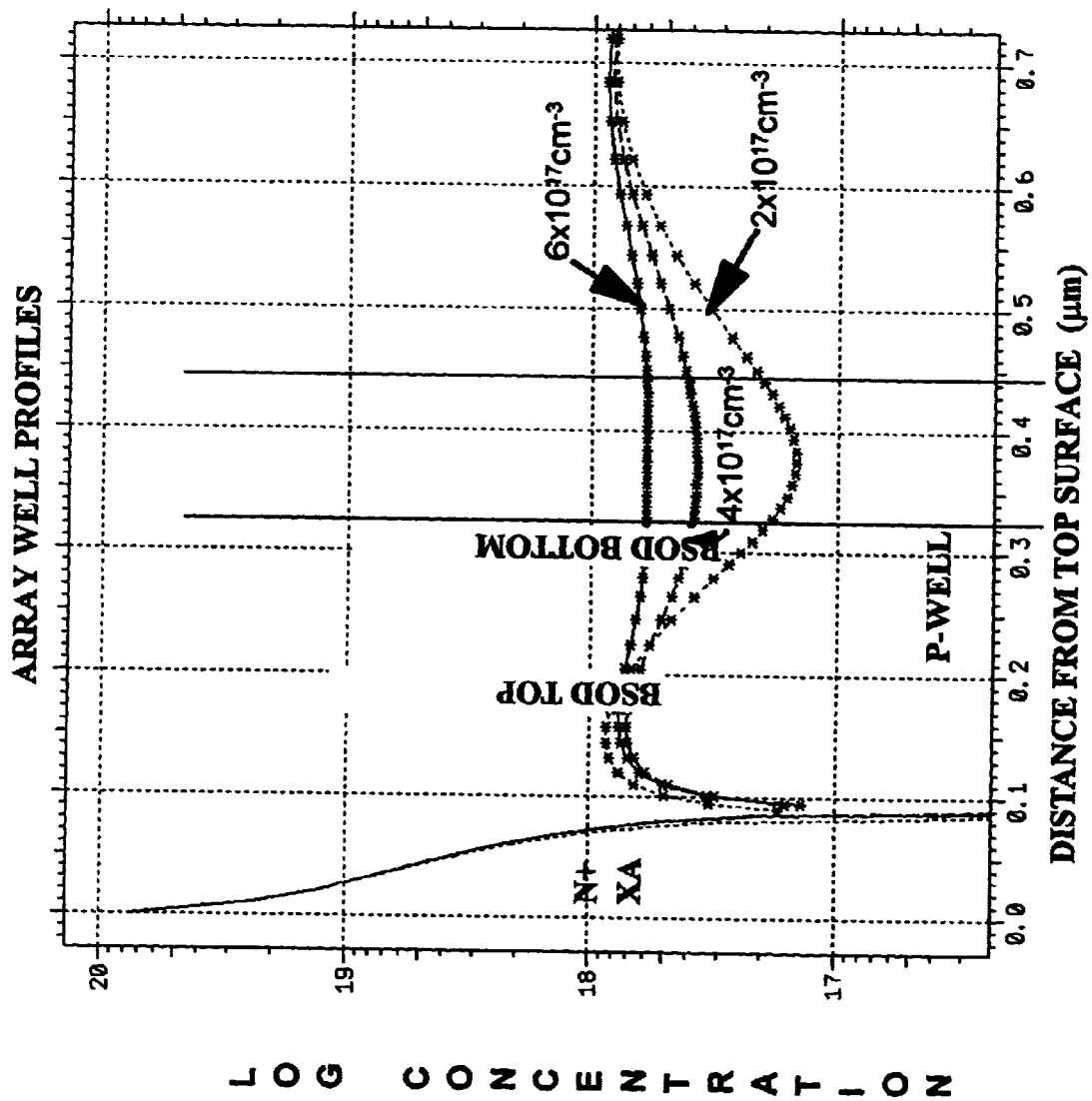
FIG. 5 is a chart of the log concentration as a function of distance from the top surface of the MOSFET for representative degrees of P-well vertical doping.
Figure 6:
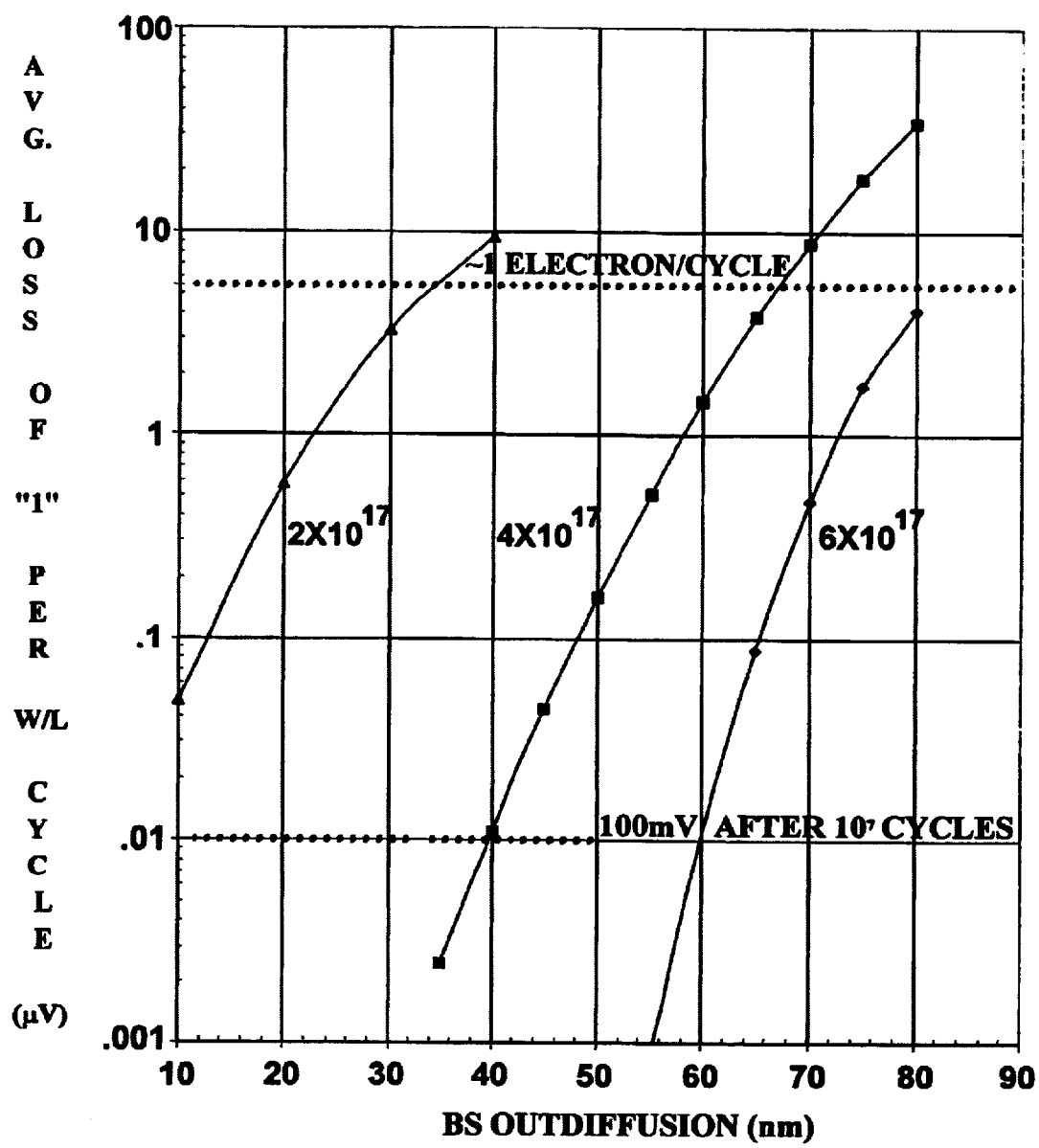
FIG. 6 is a chart of Average Loss of "1" per Adjacent Wordline (W/L) Cycle in microvolts.

FIG. 4 shows an equivalent circuit representation of back-to-back vertical MOSFET DRAM cells in accordance with FIGS. 2A and 3 the elements of which are described in TABLE I below. FIG. 5 is a chart of the log concentration as a function of distance from the top surface of the MOSFET for representative degrees of P-well vertical doping. FIG. 5 shows Vertical P-well doping profiles for the three simulated cases ($2\times10^{17}$ cm$^{-3}$, $4\times10^{17}$ cm$^{-3}$, $6\times10^{17}$ cm$^{-3}$ between straps). Channel doping has been adjusted to maintain $I_{off}$ at 5 fA/$\mu$m. FIG. 6 is a chart of Average Loss of "1" per Adjacent Wordline (W/L) Cycle in microvolts.

The problem addressed by this invention is caused by the mechanism of dynamic punchthrough between adjacent BSOD regions. It is important to note that the dynamic punchthrough mechanism is much more severe, and much more of a limiting problem than the well known static punchthrough mechanism. Simulations have demonstrated that most of the loss of a stored "1" from the left hand capacitor CL of cell L occurs when changing the data on the right hand cell R from a "1" to a "0." The worst case loss of a stored "1" occurs when the data on the adjacent cell (e.g. the right hand cell R) is repeatedly cycled between "1" and "0" without refreshing the data in the long term data retention cell (e.g. in the left hand cell L). Since as many as $10^7$ wordline cycles may occur between data refreshes of data in the long term data retention cell, a loss of stored "1" as small as 0.1 $\mu$V/cycle results in complete loss of a stored "1". The severity of the charge loss mechanism increases with decreased spacing between back-to-back storage trenches, increased strap outdiffusion, and reduced P-well doping concentration.

Since the maximum P-well doping concentration is constrained by junction leakage considerations, scalability of this cell depends on minimizing the extent of the BSOD regions.

The interaction between cells may be facilitated by reference to the equivalent-circuit model shown in FIG. 4 which shows an equivalent circuit representation of back-to-back vertical MOSFET DRAM cells in accordance with FIGS. 2A and 3, including parasitics. The dominant parasitic is due to lateral bipolar transistor QW3. FIG. 6. shows the average loss per cycle of a stored "1" on capacitor CR due repeated cycling between write "1" and write "0" on the adjacent cell which includes FET ML. The rate of loss of a stored "1" has been calculated with a full 1.5 V on the storage capacitor CR as a function of spacing between back-to-back BSOD regions, $\Delta$BSOD, with the spacing between storage trenches, $\Delta$T, as a parameter. The minimum acceptable end of process $\Delta$DT, arbitrarily considering that the maximum acceptable loss of a stored "1" is 100 mV, is indicated after $10^7$ wordline cycles. The rate of loss decreases slightly as the strength of the stored "1" is reduced because of contraction of the depletion region and expansion of the undepleted width between strap diffusions. A typical BSOD region of 50 nm from the trench sidewall is considered. It is noteworthy that the dynamic leakage mechanism sets the constraint for the minimum feature size (F). These results, which are based on conservative assumptions, support scaling of the 6 $F^2$ cell to ground rules smaller than 0.09 mm, for a cell size smaller than 0.05 mm$^2$.

The elements of this equivalent circuit are described in TABLE I where the BSOD is the extent of the metallurgical junction of the N+ strap into the P-well, as measured from the outside edge of the isolation collar into the P-well.

TABLE I

Legend for the elements shown in the equivalent circuit of FIG. 4.

| | |
|---|---|
| LWL, RWL | Wordline/GC Conductors |
| NL, NR | Storage Node Diffusions |
| BL | Bitline Diffusion |
| PWext | P-well Region Below BSOD (Buried Strap OutDiffusion) |
| PWint | P-Well Region Above BSOD |
| ML, MR | Array Vertical MOSFETS |
| QWL, QWR | Vertical Parasitic Bipolar Transistors (Bitline-to-Node) |
| QW3 | Lateral Parasitic Bipolar Transistor (Node-to-Node) |
| JW | Vertical Parasitic Double Gated JFET (Well Decoupling) |
| CBW | BL to Internal (PWint) Well Capacitance |
| CNL, CNR | Node to Internal (PWint) Well Capacitances |
| CWL, CWR | Wordline to Internal (PWint) Well Capacitances |
| CL, CR | Storage Node Capacitances |

To illustrate the seriousness of the problem of dynamic leakage, simulations for three different doping concentrations between strap diffusions ($2 \times 10^{17}$ cm$^{-3}$, $4 \times 10^{17}$ cm$^{-3}$, $6 \times 10^{17}$ cm$^{-3}$ are compared. It is important to understand the dependence of the dynamic loss of a stored "1" on P-well doping between BSOD regions since this doping concentration may have to be reduced from the currently practiced $6 \times 10^{17}$ cm$^{-3}$ to reduce strap diffusion junction leakage. The reduced P-well doping between BSOD regions puts increased importance on reducing the outdiffusion employed to form BSOD regions. For all cases, the well doping concentration in the channels of the vertical MOSFETs is adjusted to produce an off-current of 5 fA/$\mu$m. Parameters representative of 90 nm minimum feature size were applied. This translates into an end of process storage trench to storage trench spacing of 250 nm (accounts for edge bias).

For a given BSOD region outdiffusion, the scalability of the cell is limited by the minimum allowable spacing between back-to-back trenches. Alternative layouts can be used to increase the bitline pitch while maintaining desired cell area and trench-to-trench spacing.

In FIG. 6 the simulated results which are shown are expressed as the loss of a stored "1"/adjacent wordline (W/L) cycle due to cycling of the adjacent cell as a function of the BSOD region, with P-well doping concentration between BSOD regions as a parameter. Note the limits imposed on the maximum outdiffusion of the BSOD region by the dynamic leakage mechanism. It is apparent that an acceptable design point below $4 \times 10^{17}$ cm$^{-3}$ is very questionable, if light P-well doping is required to reduce BSOD region leakage current.

DESCRIPTION OF THE PREFERRED EMBODIMENT

FIGS. 7A–7C show an intermediate stage of formation of a vertical, N-channel, MOSFET device 10 with back-to-back deep trench FET sites SL/SR with bilateral strap outdiffusion regions (FIGS. 7A/7B), containing deep trench capacitors C, which solves certain problems in accordance with the method of the present invention. FIGS. 7A/7C show additional deep trench capacitors at sites ST/SB. Well known standard processing is followed through formation of the deep trench capacitors C in preparation for formation of vertical MOSFETs in the array. This entails etching of a plurality of Deep Trenches (DT's) 13 the locations of which are indicated in FIGS. 7A and 7C through a first silicon nitride (SiN) pad nitride layer SN1 into a silicon 15 semiconductor substrate 15.

Then referring to FIGS. 7B and 7C a plurality of deep trench capacitors C are formed in the lower portions of plurality the DT's 13. The capacitors C share an N+ doped buried, plate 12 which serves at the outer electrode of the capacitors C.

The buried plate 12 is preferably formed by diffusion from the lower portions of the DT's 13 using well known techniques, as will be well understood by those skilled in the art and as described in more detail in commonly assigned U.S. Pat. No. 6,452,224 of Mandelan et al. for "Method for Manufacture of Improved Deep Trench EDRAM Capacitor and Structure Produced Thereby". The plate 12 surrounds the lower portions and the bottom of the deep trenches (DT's) 13. Then node dielectric layers 11 are formed on the sidewalls and bottom of lower portions of the DT's 13. The node dielectric layer 11 (composite of silicon oxide and silicon nitride) is formed on the lower portion of the inner wall of the plate 12, i.e. the wall of DT's 13 between the inner electrode 17 (also referred to as the storage node or node conductor) and plate 12.

Next, isolation collars 16 are formed on the sideways of the DT's 13 above the node dielectric layer 11, but well below the tops to the DT's 13 and overlapping the lower portions of the N+ doped strap/outdiffusion regions 19, OL and OR that comprise outdiffusion regions as in FIG. 2. Thus, the node dielectric layers 11 and the isolation collars 16 line the surfaces of the lower portions of the DT's 13 leaving space wherein the capacitor nodes 17 are to be formed.

A P-well 14 which is to be formed in the substrate 15 in the future, after the process steps of this invention is shown in phantom in FIGS. 7B and 7C above the plate 12 surrounding the upper portion of the DT's 13 to facilitate understanding of the implications of the process of this invention. Note that the bottom of the collar 16 and the lower surface of the P-well 14 (i.e. the P-well 14/N+ plate 12 junction) are preferably coplanar.

Then the Deep Trench Fill node 17 (referred to hereinafter as DT fill node 17) which form the nodes (inner electrodes) of the capacitors C was deposited into the DT's 13. The DT fill node 17 comprises N+ doped polysilicon located in the lower portions of the DT's 13 inside the node dielectric layers 11 and the isolation collars 16 reaching up above the tops of the isolation collars 16 in the DT's 13 to contact the strap/outdiffusion regions 19/OL/OR in the P-well regions 14. In other words, the DT fill node 17 that forms the capacitor nodes comprises plug composed of N+ doped polysilicon, which completely fills the lower portion of the DT's 13 inside the collars 16 and the node dielectric layers 11 which line most of the inner walls of the DT's 13.

Above the collar 16, the top portion of each DT fill node 17 is in contact with a portion of an N+ doped strap/outdiffusion regions 19/OL/OR which is formed extending into the P-well 14.

The N+ doped strap regions 19/OL/OR also define the first source/drain diffusion of the vertical MOSFET. The strap/outdiffusion regions 19/OL/OR are juxtaposed with the edges of the DT's 13 and they are exposed to a surface of the DT fill node 17, in direct electrical and mechanical contact with the upper portion of the DT fill node 17. The strap/outdiffusion regions 19/OL/OR were formed by outdiffusion of dopant from the DT fill node 17 into the P-well 14 of some of the N+ dopant from N+ doped, polysilicon fill from the DT fill node 17.

On the sidewalls of the DT's 13, above DT fill node 17 (well above isolation collar 16) there is a thin layer of a gate oxide layer 18 lining the sidewalls of the DT's 13 reaching from the top of the DT fill node 17 to the top surface of the silicon substrate 15. Thus there is a partial overlap of the center of the straps/outdiffusion regions 19/OL/OR with the lower portion of the gate oxide layer 18.

Above the DT fill node 17 and inside the gate oxide layer 18, the DT's 13 are partially filled with a thin layer of a dielectric comprising a Trench Top Oxide (TTO) layer 24 which separates the DT fill node 17 (the inner electrode of the capacitors C) from the gate electrode (GC) 20 which are to be formed thereabove.

In addition, elements of the vertical MOSFETs (gate oxide 18, and the N+ doped polysilicon gate conductor (GC) 20 are formed to fill the top of the DT's 13.

Above the TTO layer 24 and also inside the gate oxide layer 18, the DT's 13 are filled to the top with a Gate Conductor (GC) 20 comprising an N+ doped polysilicon conductive material. The GC's 20 extend to the top of the DT's 13. Thus, the gate oxide layer 18 provides electrical insulation between the GC's 20 and the P-well 14.

The GC's 20 are planarized to the level of a pad silicon nitride (SiN) layer SN1 which originally covered the silicon substrate 15 before the DT's 13 were formed. Following planarization of the GC polysilicon 20, a second SiN layer SN2 was deposited. The remaining portions of the first SiN layer SN1 and the second SiN layer SN2 serve as masking material during the etching of several isolation trenches IT (shown in FIGS. 7A and 7C) in the silicon substrate 15.

Figure 8C:
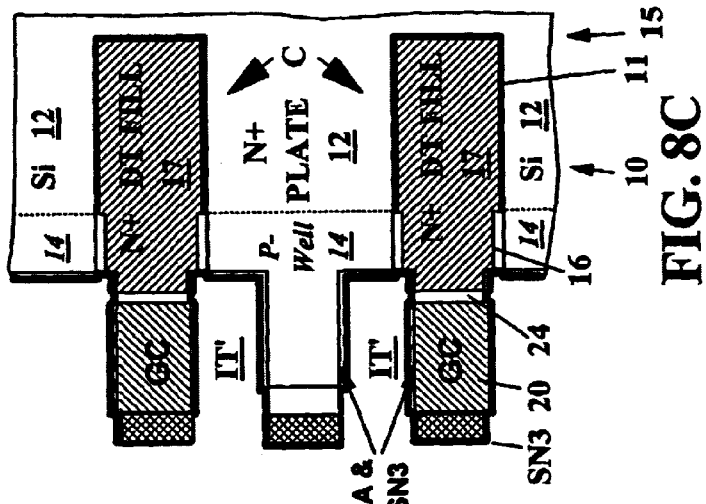
FIGS. 8A–8C show the device of FIGS. 7A–7C after growth of an active area liner composed of silicon oxide, followed by deposition of a conformal silicon nitride liner on the sidewalls of the isolation trenches and with the conformal silicon nitride liner covering a previously deposited silicon nitride layer.
Figure 8A:
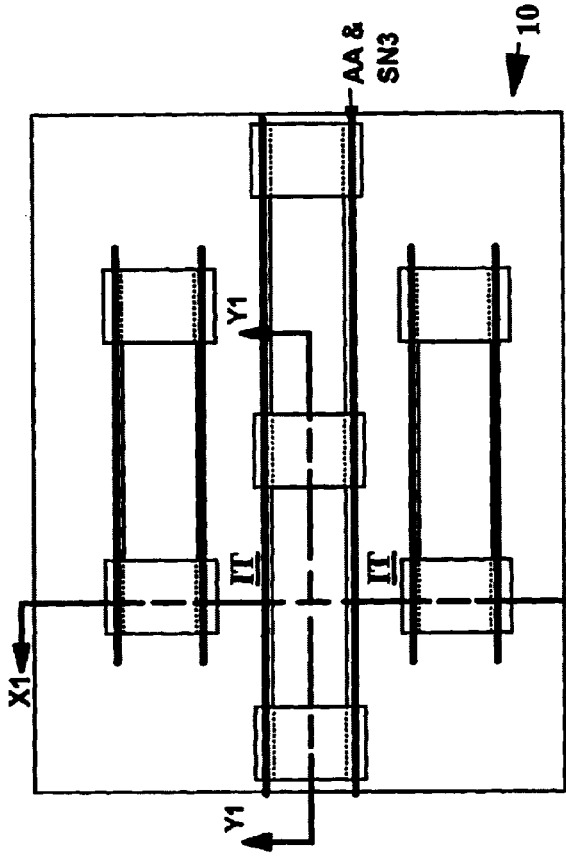
Figure 8B:
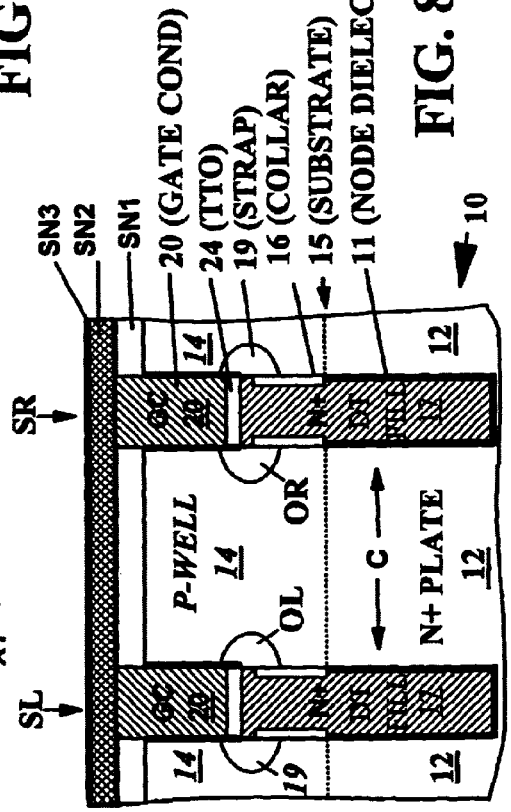

FIGS. 8A–8C show the device 10 of FIGS. 7A–7C after growth of an active area liner AA composed of silicon oxide, followed by deposition of a conformal silicon nitride liner SN3 on the sidewalls of the isolation trenches IT forming narrower isolation trenches IT' and with the conformal silicon nitride liner SN3 covering a previously deposited silicon nitride layer SN2, as shown in FIGS. 8B and 8C. In FIGS. 8A and 8C, the isolation trenches IT and active area stripes AA are visible in the plan and X1—X1 cross-sectional views shown in FIG. 8C. Note that to ensure that the buried strap diffusions 19 (that are subsequently formed) are isolated between adjacent active area stripes AA, the etch depths of the isolation trenches IT into the silicon 15 go beyond the top surface of the deep trench polysilicon fill node 17.

Above the P-well 14 on the sides to the DT's 13 in a final product formed after the process of this invention, it is intended there would be N+ XA implant regions (not shown for convenience of illustration) for NFET devices of the N channel device. The N+ XA implant regions will define the second source/drain diffusion of the vertical MOSFET. It should be noted that this description also applies to P channel devices and would differ as to the doping of the well 14, the plate 12, the strap/outdiffusion regions 19/OL/OR, the inner electrode 17 and the N+ XA implant regions shown in Mandelman et al. U.S. Pat. No. 6,452,224, supra. FIGS. 9A and 9B show the device of FIGS. 8A–8C after a layer of Chemical Vapor Deposition (CVD) oxide was conformally deposited and etched by Reactive Ion Etching (RIE) to form oxide spacers shown in FIGS. 9A and 9B on the sidewalls of the silicon oxide stripes.

FIGS. 9A and 9B show the device 10 of FIGS. 8A–8C after an isolation trench insulator 26 has been deposited into narrower isolation trenches IT', followed by planarization thereof and deposition of a fourth SiN layer SN4 comprising a thin blanket etch stop layer. Then a silicon oxide layer 27 was deposited and formed into silicon oxide stripes 27. Then a conformal silicon oxide layer was deposited by Chemical Vapor Deposition (CVD) and etched by Reactive Ion Etching (RIE) to form oxide spacers SP shown in FIGS. 9A and 9B on the sidewalls of the silicon oxide stripes 27.

Referring to FIG. 9C, the narrower isolation trenches IT' were filled with a partially-sacrificial isolation trench insulator 26 composed of silicon oxide or other suitable insulator. Then isolation trench insulator 26 is planarized to the level of the top surface of the second silicon oxide layer SN2. It is acceptable for some of the SiN material from the second silicon oxide layer SN2 to be removed during the process of planarization of the isolation trench insulator 26. Typical, as these are high aspect ratio isolation trenches, the use of an High Density Plasma (HDP) oxide deposition is preferred to form silicon oxide as the isolation trench insulator 26.

Then as shown in FIG. 9B, a fourth SiN layer SN4 is formed as a thin blanket etch stop layer which is to be used subsequently.

Next, as shown in FIGS. 9A and 9B a blanket deposit of a CVD silicon oxide layer 27 is deposited over the layer SN4.

Then, as shown in FIGS. 9A and 9B the CVD oxide layer is patterned into silicon oxide stripes 27 running orthogonally to the active area (AA) stripes (vertically in FIG. 9A), that are nominally aligned with the storage trenches. U.S. Pat. No. 6,339,241 of Mandelman et al. for "Structure and Process for 6 $F^2$ Trench Capacitor DRAM Cell with Vertical MOSFET and 3 F+ Bitline Pitch" describes and shows an active area (AA) patterned as a stripe on the semiconductor surface.

During the patterning of the silicon oxide stripes 27, the thin, fourth SiN layer SN4 serves as an etch stop.

Referring again to FIGS. 9A and 9B, the device 10 of FIGS. 8A–8C is shown after a layer of Chemical Vapor Deposition (CVD) oxide was conformally deposited and etched by Reactive Ion Etching (RIE) to form oxide spacers SP shown in FIGS. 9A and 9B on sidewalls of the silicon oxide stripes 27. Oxide spacers SP serve to reduce the spacing between adjacent oxide stripes 27 to less than a minimum feature size, providing improved containment of the augmented doping region to be introduced through the apertures between the sidewall spacers SP.

Figure 10C:
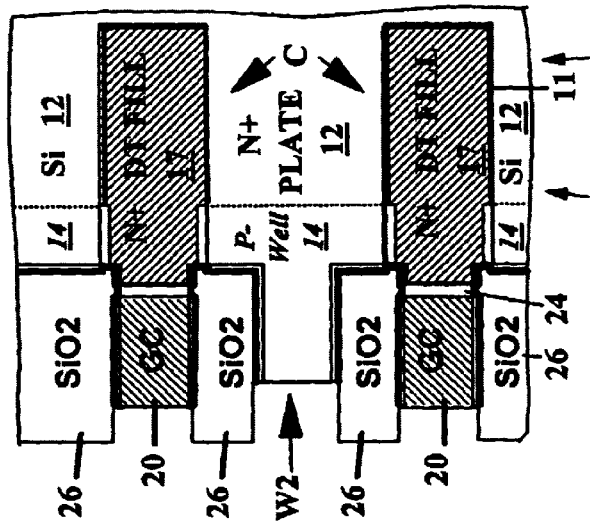
In FIGS. 10A–10C show the device of FIGS. 9A–9C after the silicon nitride material not masked by the silicon oxide stripes and spacers is etched through the four silicon nitride layers by an RIE process to form windows therethrough.
Figure 10A:
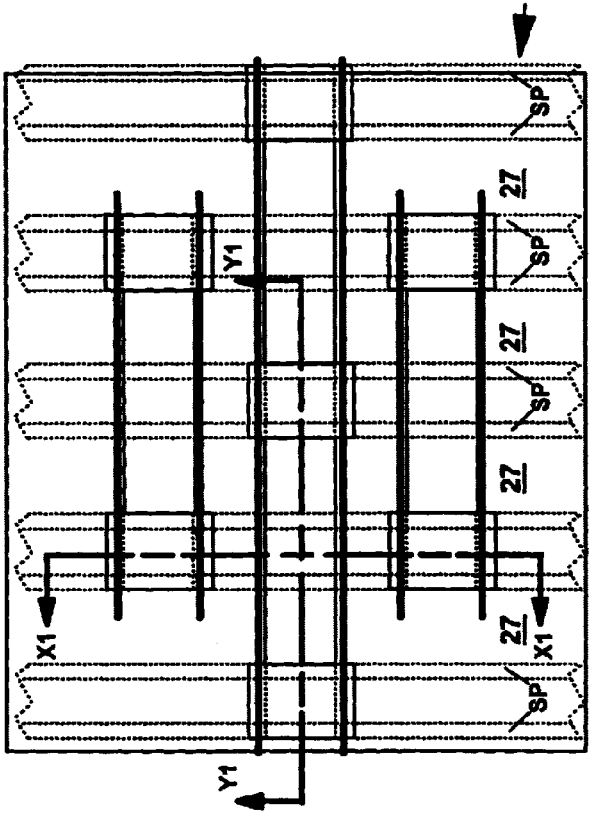
Figure 10B:
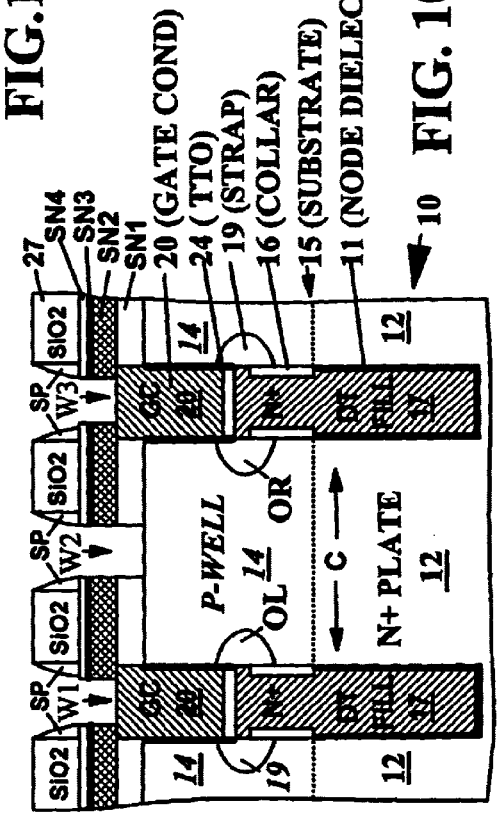

FIGS. 10A–10C show the device of FIGS. 9A–9C after the portions of the laminated SiN layers SN1–SN4 not masked by silicon oxide stripes 27 and spacers SP is etched to form windows W1/W2/W3 through the four SiN layers SN1–SN4 by an RIE process (by access through the stripes 27 and spacers SP) using a reagent, as is well understood by those skilled in the art, which is selectively inert to silicon oxide and which attacks silicon nitride, exposing the top surface of the silicon substrate 15 in windows W1/W3 and the N+ GC polysilicon in wide central window W2.

Figure 11A:
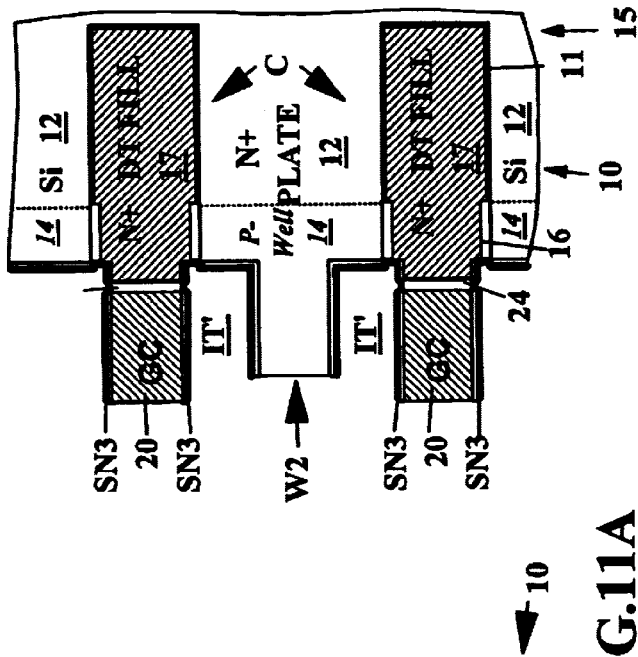
FIGS. 11A–11C show the device of FIGS. 10–10C after removal of the silicon oxide stripes and the spacers.
Figure 11B:
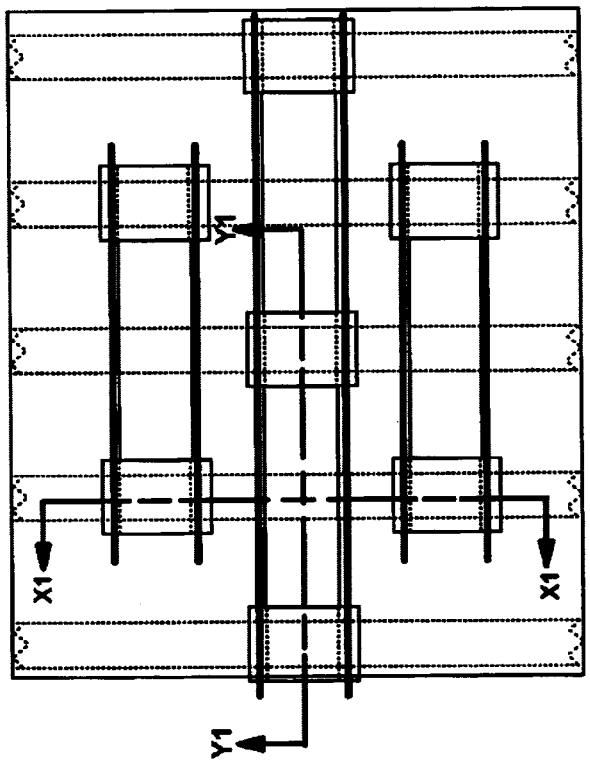
Figure 11C:
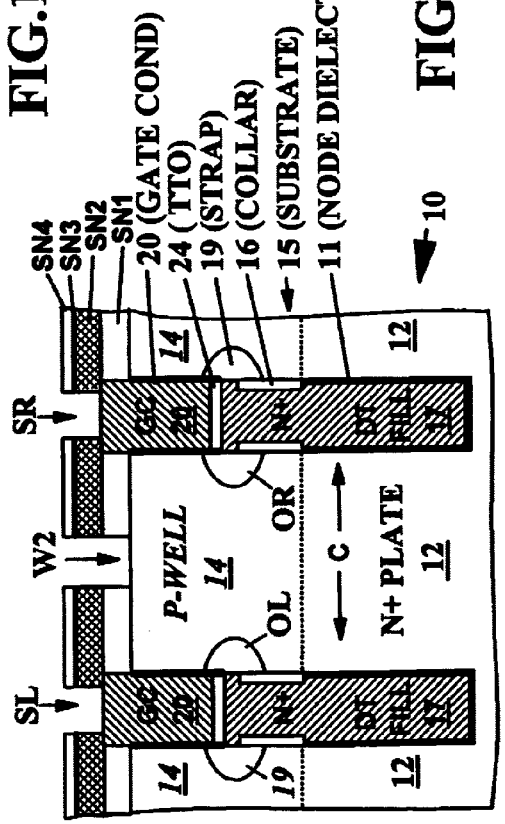

FIGS. 11A–11C show the device of FIGS. 10A–10C after removal of the silicon oxide stripes 27 and the spacers SP. As shown in FIG. 11C, the exposed isolation trench insulator 26 assumed to be composed of silicon oxide in the isolation trenches IT' is etched by RIE selective to silicon and SiN. During the oxide RIE the oxide stripes 27 and associated oxide spacers SP are removed. This RIE process opens the trenches IT', exposing the SiN liner between adjacent rows of back-to-back cells on either side of window W2.

Figure 12A:
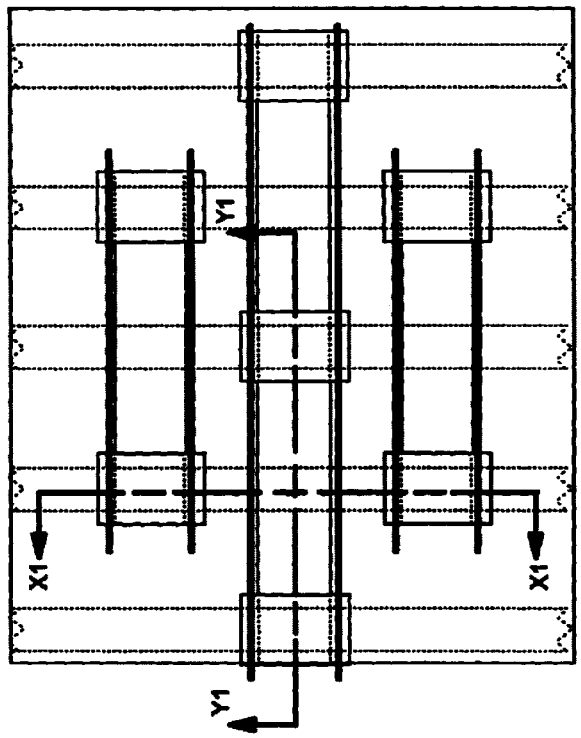
FIGS. 12A–12C show the device of FIGS. 11A–11C after ion implantation of boron ions into the isolation diffusion region through the middle window.
Figure 12C:
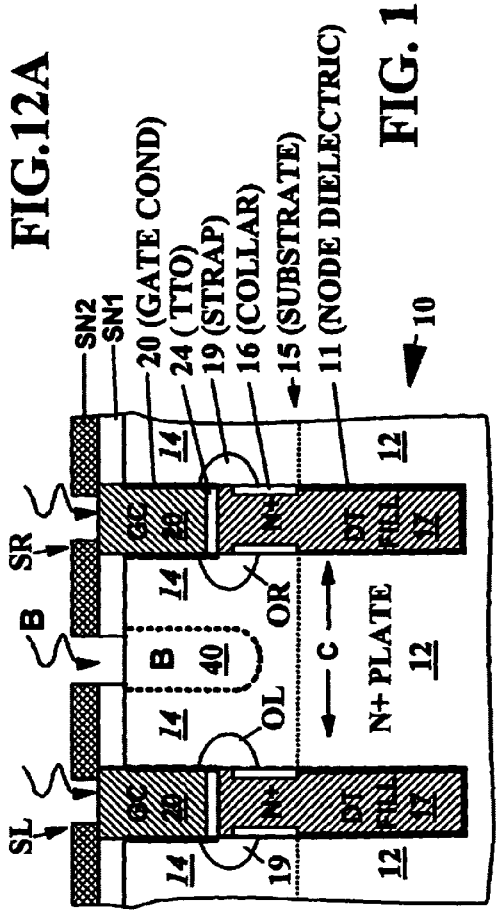
Figure 12B:
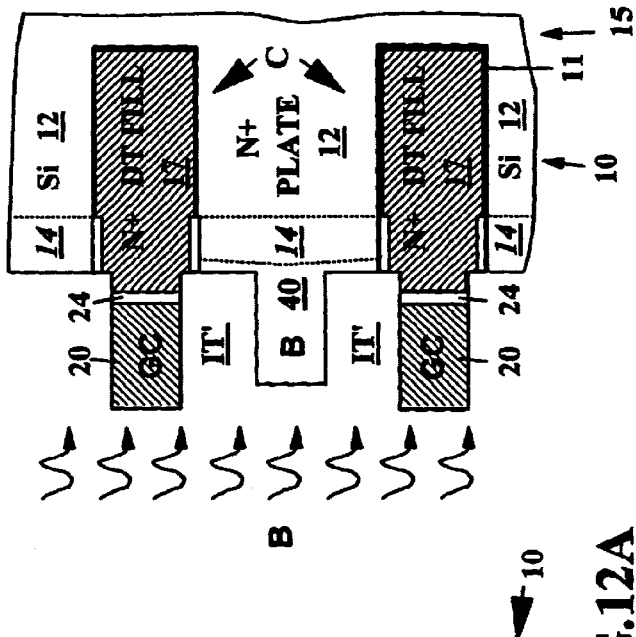

FIGS. 12A–12C show the device of FIGS. 11A–11C after ion implantation of boron ions into the isolation diffusion region 40 through the window W2. FIG. 12C shows that the exposed SiN liner SN3 has been removed by means of a short isotropic etch through the window W2 which is very wide in FIG. 12C crossing over both of the isolation trenches IT. The now exposed underlying AA oxide liner was also removed as illustrated by FIG. 12C with a short isotropic etch. Then, as illustrated by FIGS. 12B and 12C, an N type dopant B (boron preferred) is introduced via aperture/window W2 into the exposed surfaces of the portion of substrate 15 where an N+ doped isolation diffusion region 40 is shown in the P-well 14. Methods for forming the isolation diffusion region 40 include any one or a combination of well known methods. Some examples include, but are not limited to methods such as gas phase doping, angled ion implantation, doping from solid sources such as BSG or doped poly, plasma immersion doping, etc. The N+ doped isolation diffusion region 40 isolates or separates the field which will exist surrounding the outdiffusion region OL' from the fields which will exist surrounding the outdiffusion region OR' of adjacent FET sites by the projection of isolation diffusion region 40 therebetween, as contrasted with the outdiffusion regions OL and OR in FIG. 2A.

Figure 13C:
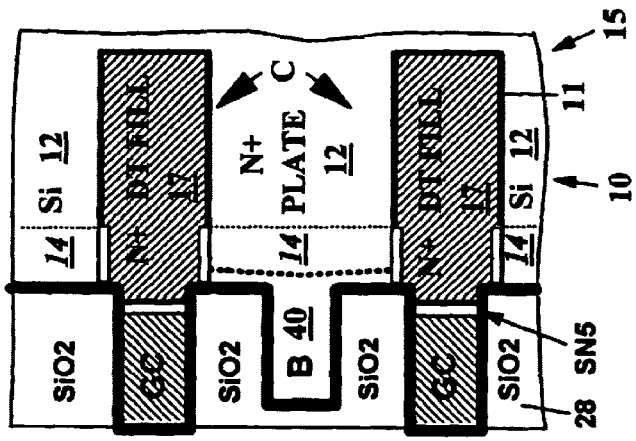
FIGS. 13A–13C show the device of FIGS. 12A–12C after an additional (fifth) blanket silicon nitride liner has been deposited on the surface of the device.
Figure 13A:
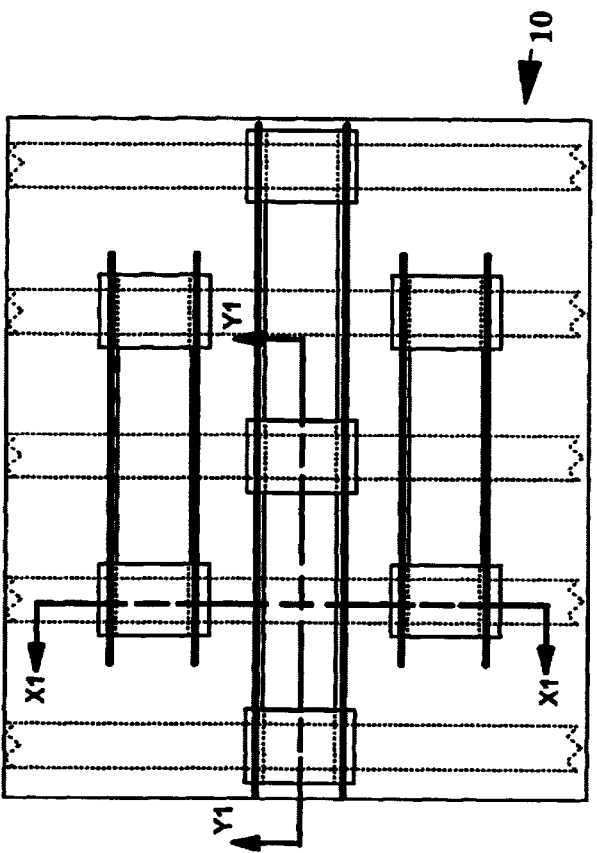
Figure 13B:
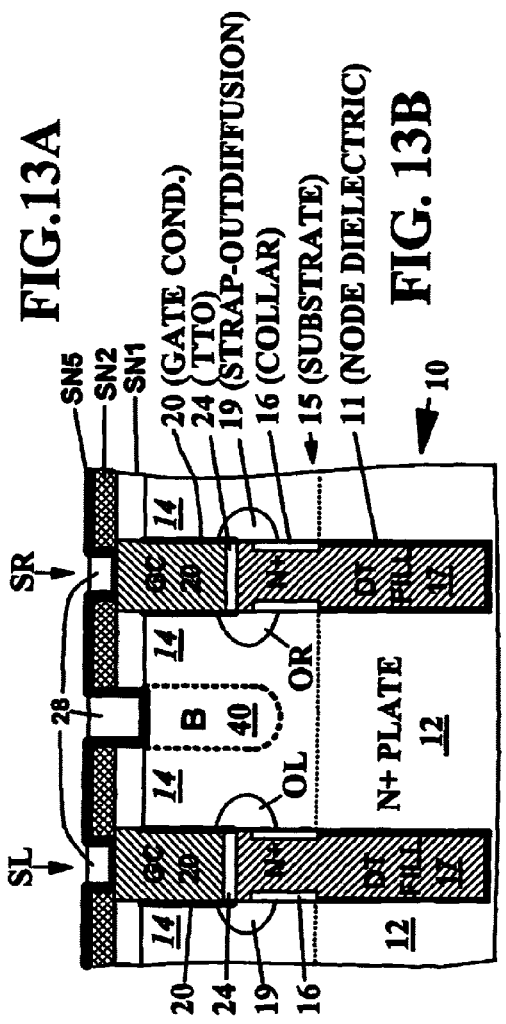

FIGS. 13A–13C show the device 10 of FIGS. 12A–12C after an additional blanket SiN finer SN5 has been deposited on the surface of device 10. Optionally, a sidewall oxide may be grown prior to deposition of the SiN liner. Subsequently, silicon oxide fill 28 (preferably HDP) is deposited and planarized to the nitride stack surface. It is acceptable that some SiN be removed during planarization steps. Conventionally practiced processing resumes from this point to chip completion including the formation of wells, gates, source/drain diffusions and forming wordline and bitline conductors, interlevel dielectrics, and upper wiring levels.

Modeled Results Demonstrating Operability of the Invention

The process steps described in the previous section have been simulated to assess the operability of the invention. Thermal budget steps following the formation of the augmented doping region, as currently practiced in the present process, have been applied to determine the degree of containment of the augmented doping region at the end of process.

Figure 14:
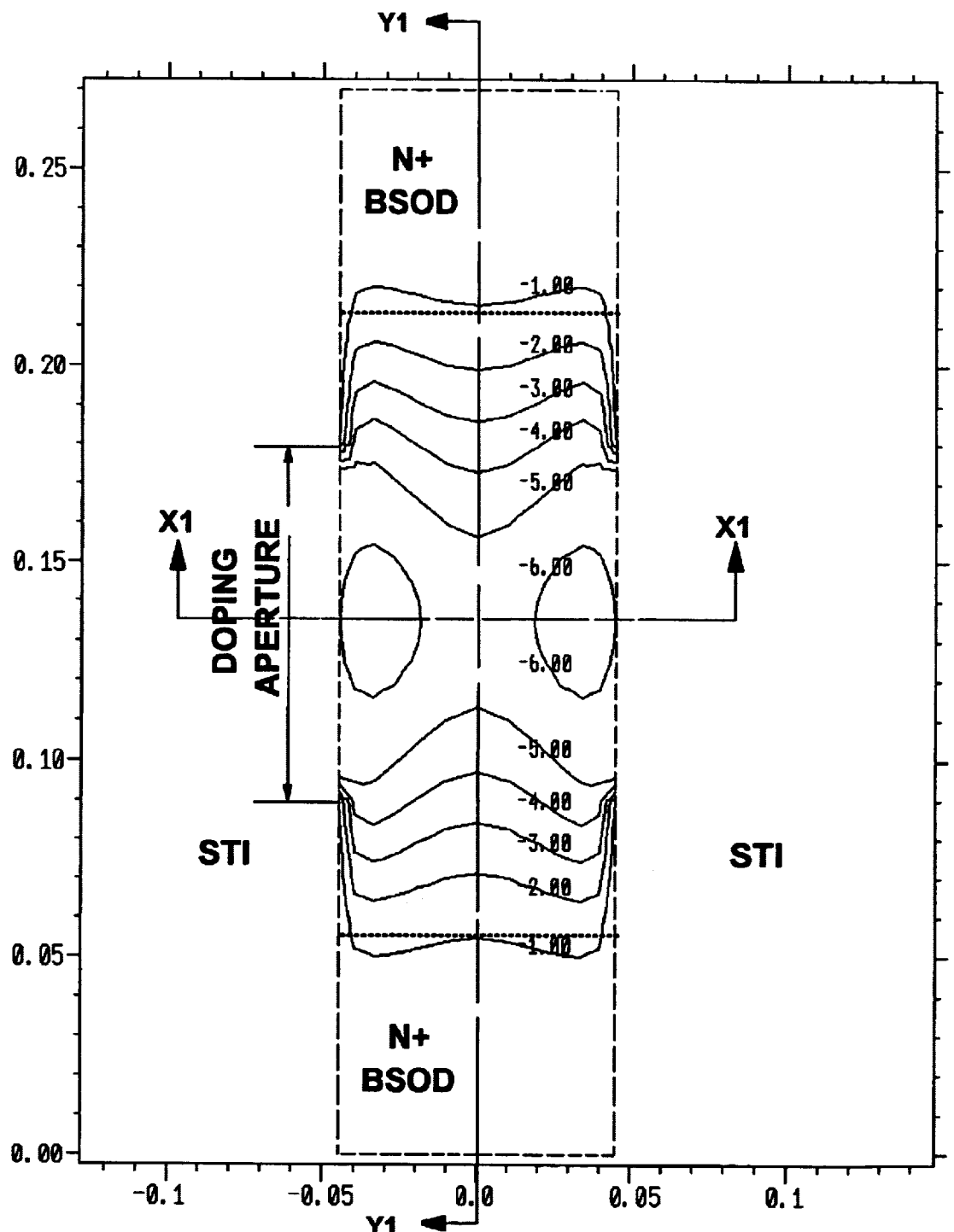
FIG. 14 shows modeled contours of constant doping added from the sidewall aperture, at end of process (after all thermal processing), in a horizontal plane cutting through the center of the strap outdiffusions.

FIG. 14 shows modeled contours of constant doping added from the sidewall aperture, at end of process (after all thermal processing), in a horizontal plane cutting through the center of the strap outdiffusions. Note that the augmented doping is well confined to the width of the aperture.

Figure 15:
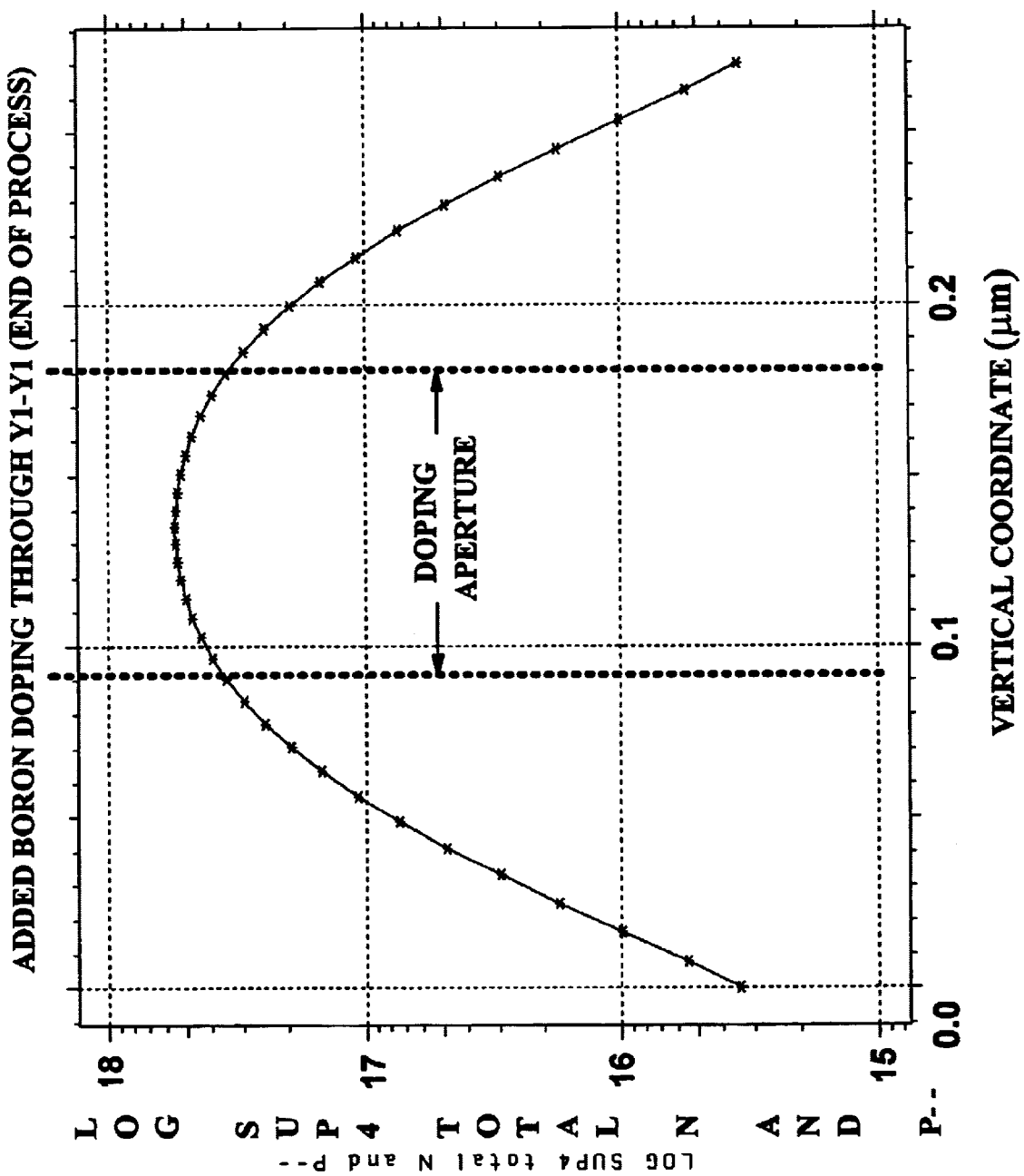
FIG. 15 shows a line plot along line Y1—Y1 (as shown in the cut plane of FIG. 14) of added doping from an aperture accordance with this invention.
Figure 16:
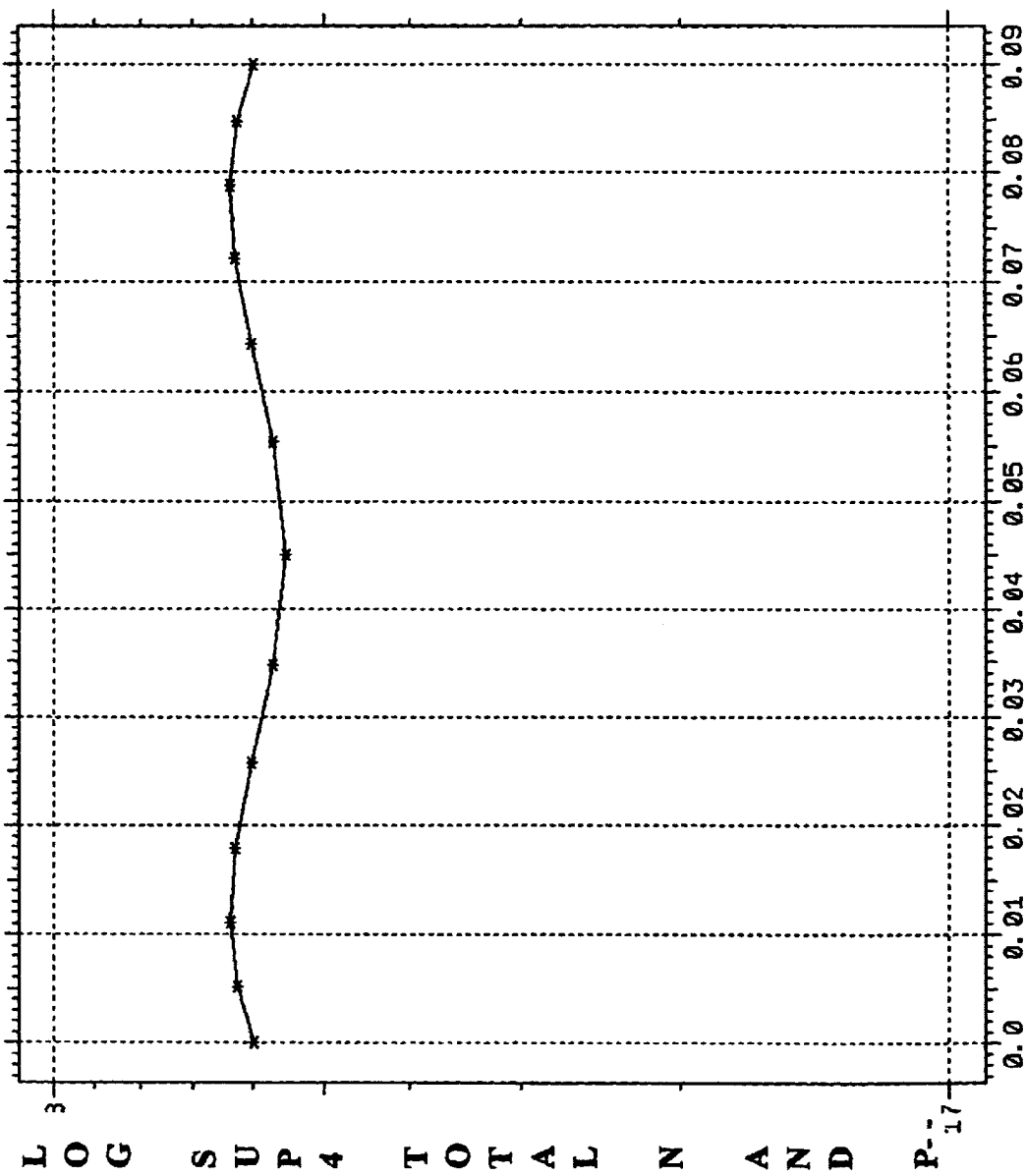
FIG. 16 shows a line plot taken along line X1—X1 (as shown in the cut plane of FIG. 14) of added doping from an aperture in accordance with this invention.

Corresponding line plots are shown in FIGS. 15 and 16.

In FIG. 15, a line plot along line Y1—Y1 (as shown in the cut plane of FIG. 14) of added doping from an aperture accordance with this invention. The augmented, i.e. added, doping remains well confined to the width of the aperture.

FIG. 16 shows a line plot taken along line X1—X1 (as shown in the cut plane of FIG. 14) of added doping from an aperture in accordance with this invention. The variation in added doping across the width of the active area as shown in FIG. 16 is relatively small.

Figure 17:
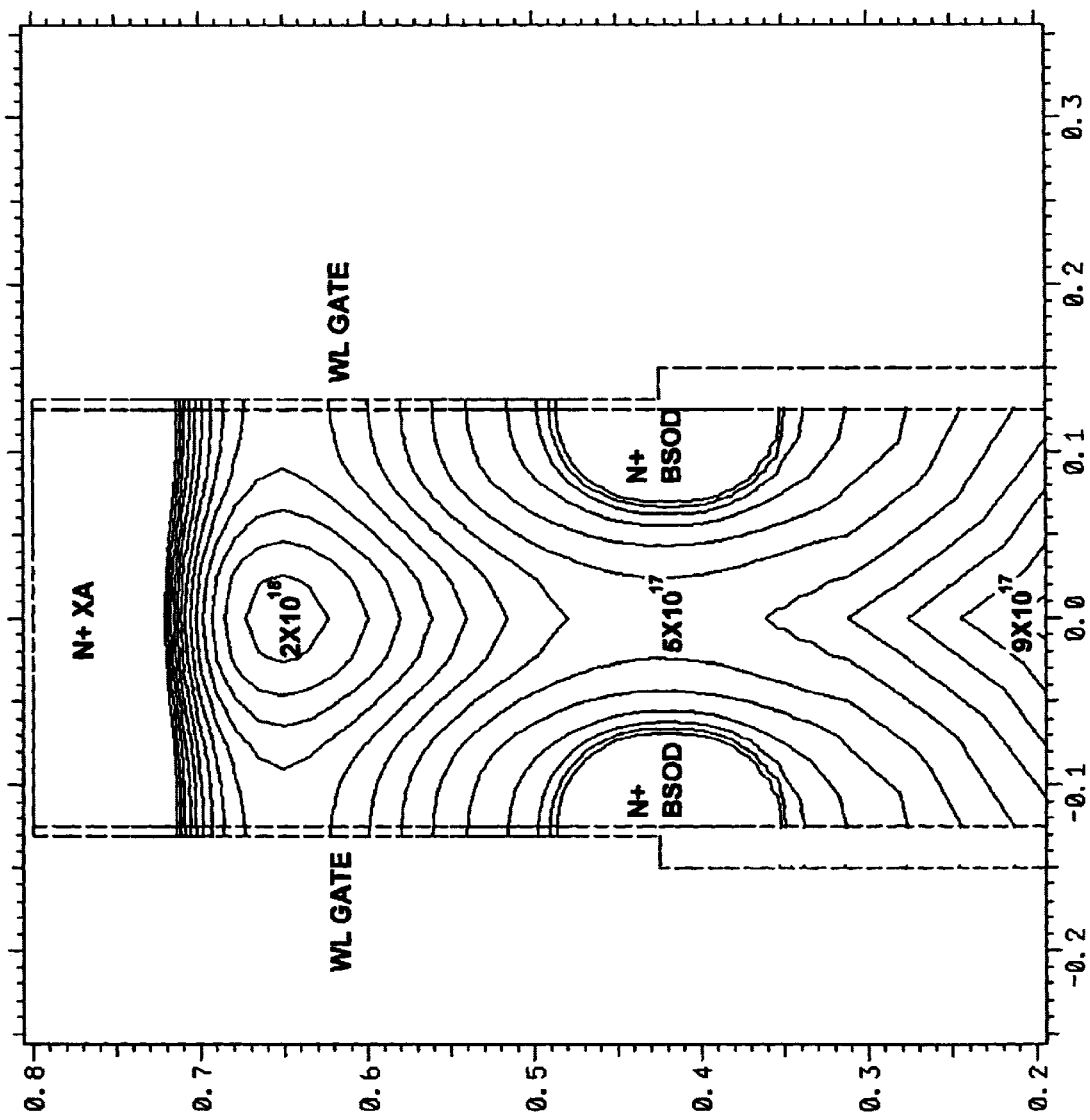
FIG. 17 shows a set of modeled constant concentration contours of total doping at end of process in a vertical plane cutting through cross-section Y1—Y1.

FIG. 17 shows a set of modeled constant concentration contours of total doping at end of process in a vertical plane cut through cross-section Y1—Y1. A doping aperture width of 90 nm (1 F) centered midway between storage trenches was used. It is noted that the enhanced doping region is well confined to the central region.

Electrical Implications of Invention

Figure 18:
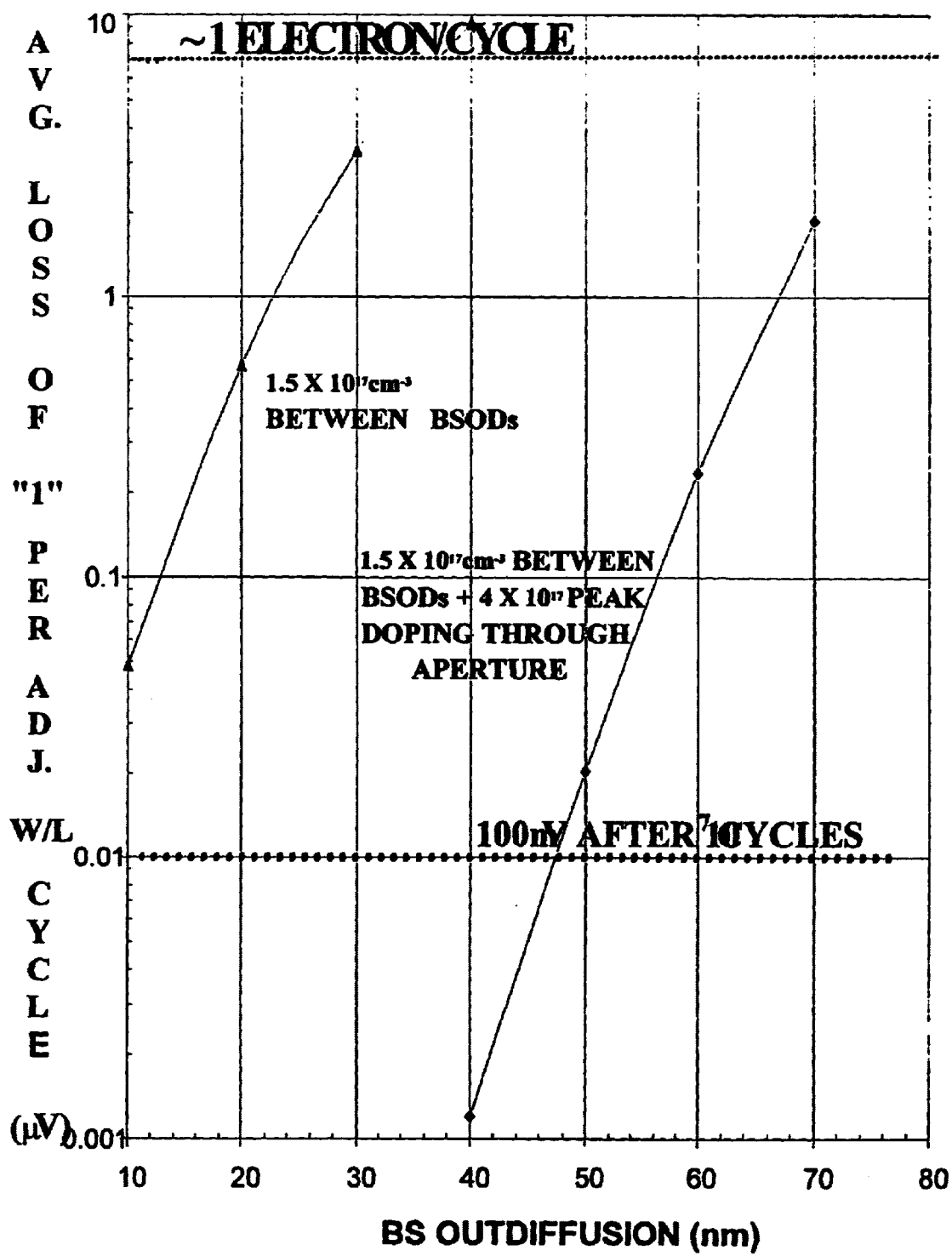
FIG. 18 is a chart of Average Loss of "1" per Adjacent Wordline (W/L) Cycle for a device manufactured in accordance with the method of this invention.

A. Degree to which Strap Outdiffusion Requirements Can Be Realized without Exceeding a Desired P-well Doping Concentration at the Strap FIG. 18 is a chart fo Average Loss of "1" per Adjacent Wordline (W/L) Cycle in microvolts for a device manufactured in accordance with the method of this invention. FIG. 18 shows a modeled effect of augmented P-well doping through the window W2 (aperture), which compares the reduction in dynamic loss of a stored "1" for the inventive structure relative to the structure of FIGS. 2 and 3 as illustrated by FIG. 6, for the case of a doping concentration of $\sim 1.5 \times 10^{17}$ $cm^{-3}$ between the strap diffusions (BSOD's). The curve on the lower right in FIG. 18 shows the effect addition of doping through the aperture having a peak concentration of $4.0 \times 10^{17}$ $cm^{-3}$ which very substantially improves the situation by a ratio of chose to 5:1.

Figure 19:
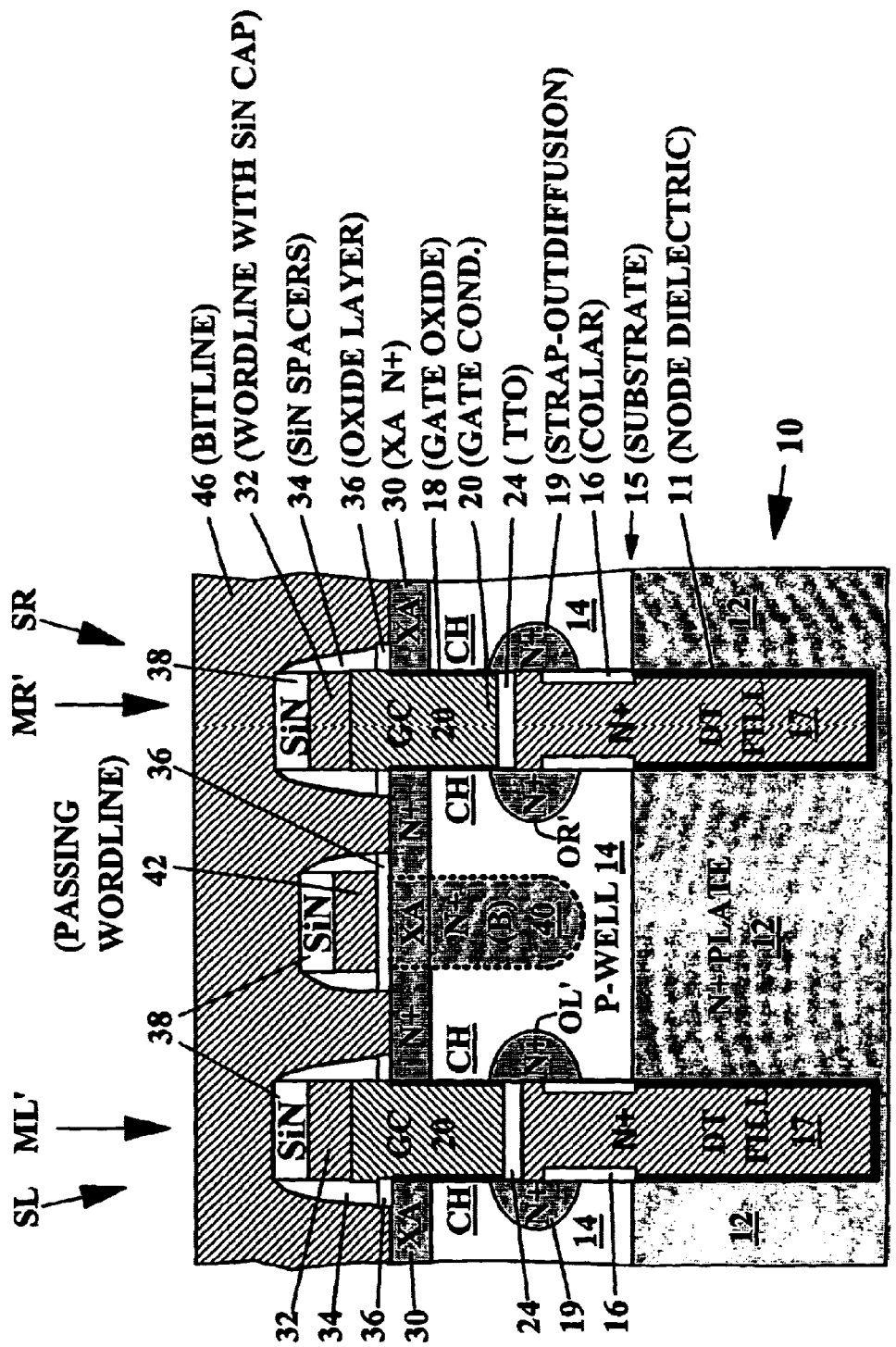
FIG. 19 shows a sectional elevation of a back-to-back pair of completed vertical FETs based upon FIG. 13B illustrating an embodiment of a completed MOSFET device formed by performing additional processing steps.

FIG. 19 shows a sectional deviation completed of a back-to-back pair of completed vertical FETS ML'/MR' based upon FIG. 13B illustrating an embodiment of a completed MOSFET device formed by performing numerous additional well known processing steps after the steps of this invention have been completed. Such well known processing steps are, applied to the device 10 of FIG. 13B to arrive at the final structure shown in FIG. 19. The steps include deposition of an insulator layer 36, conductor layers 32,40/46, insulating spacers 34, nitride layer 38. In addition processing steps including masking, and etching etc. are employed to produce the device shown in FIG. 19.

As shown in FIG. 19, the P-well 14 has been forced and, subsequently, the top surface of the P-well 14 has been doped with N+ dopant to form a set of XA implant regions 30, near the top (outermost) surface of the P-well 14. The N+ XA implant regions 30 define the source diffusion of the vertical MOSFETS ML'/MR'. It should be noted that this description also applies to P channel devices where the doping would be reversed in the well 14, the plate 12, the strap region 19, the inner electrode 17 and the implant region 30 and the sources and the drains are interchangeable.

Note that FET channels CH are formed between the source regions 30 and the outdiffusions 19 on either side of each of the deep trenches, juxtaposed with the gate conductors GC 20 on the other sides of the gate oxide layers 30. A silicon oxide insulating layer 36 has been formed over the surface of the device 10 aside from the gate conductors 20 which project therethrough.

Two wordlines 32, which are electrical conductors, extend into the page in FIG. 19. Wordlines 32 have been formed over the gate conductors 20, in contact therewith. A passing wordline 42 (midway between wordlines 32) is formed above the portion of silicon oxide insulator layer 36 which overlies the isolation diffusion region 40. Wordlines 32 and passing wordline 42 are capped by silicon nitride caps 38 to form wordline stacks and silicon nitride spacers 34 are formed on the sidewalls of the wordline stacks, thereby insulating the wordlines from the blanket bitline 46 metallization formed thereover. Bitline 46 reaches down through holes in the silicon oxide insulator layer 36 to reach electrical and mechanical contact to the XA source regions 30 formed on the surface of the P-well 14. The holes in the insulator 36 are juxtaposed with the spacers 34. The bitline 46 is in direct electrical contact with the XA source regions 30.

B. Doping Concentration Adjacent to the Strap Diffusion Junction for a Given Peak Concentration Midway between Straps Even a strap outdiffision as small as 10 nm is unacceptably large with the structure of FIGS. 2 and 3 since it falls to provide sufficient immunity to the dynamic charge loss mechanism when the doping between straps is $1.5 \times 10^{17}$ $cm^{-3}$.

Addition of boron diffusion through the window W2 (aperture) having a peak concentration of $4.0 \times 10^{17}$ $cm^{-3}$ allows a strap outdiffusion as large as 47 nm to be acceptable for use.

C. Consequences of Misalignment of the Doping Aperture Stripes with Respect to the Storage Trenches For a peak P-well total doping concentration of $5.5 \times 10^{17}$ $cm^{-3}$ midway between straps and with a strap outdiffusion of 47 nm, the P-well doping concentration at the strap diffusion junction is $1.9 \times 10^{17}$ $cm^{-3}$ for the nominally aligned case. For 3 sigma misalignment ($\Delta=30$ nm), the concentration at the junction rises to $4.1 \times 10^{17}$ $cm^{-3}$. However, this compares with the concentration at the junction of $4.7 \times 10^{17}$ $cm^{-3}$ required for a uniform concentration between straps, required to support a strap outdiffusion of 47 nm for the structure of FIGS. 2 and 3. Therefore, even for a hypothetically worst case misalignment scenario, the inventive structure provides both a significant improvement of both isolation and junction leakage over the structure of FIGS. 2 and 3.

No other solutions are known which allow the same degree of reduction in cell-to-cell interaction, without compromising junction leakage. It has been shown herein that by introducing the augmented doping through an active area sidewall aperture, the profile may be sharply confined to the aperture.

An alternate solution using a boron ion implant into the top surface of the active area would result in excessive spreading at the depth of the strap. This alternate solution would improve cell-to-cell isolation at the expense of increased strap junction leakage and is effective only for ground rules which are approximately one generation larger (110 nm) than those contemplated by the invention described herein (90 nm and below).

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a vertical transistor memory cell structure with back-to-back FET cells formed in a planar semiconductor substrate with a plurality of deep trenches having vertical FET devices and a plurality of capacitors each located in a separate trench that is formed in a doped region in the semiconductor substrate; with bilateral outdiffusion strap regions formed extending into the doped region and with adjacent deep trenches having confronting pairs of outdiffusion regions extending from adjacent deep trenches into the doped region, comprising the step of:

forming an isolation diffusion region in the doped region between the back-to-back cells separating confronting outdiffusion strap regions.

2. The method of claim 1 including, before forming the isolation diffusion region, performing the steps of:

forming an isolation trench masking layer with openings between rows of deep trenches, and then etching through the openings in the isolation trench masking layer to form isolation trenches between rows of deep trenches.

3. The method of claim 1 including, before forming the isolation diffusion region, performing the steps of:

forming a parallel array of active area liners composed of silicon oxide, then depositing a conformal first silicon nitride liner on the sidewalls of the isolation trenches thereby narrowing the isolation trenches and above other surfaces of the structure.

4. The method of claim 2 including, before forming the isolation diffusion region, performing the steps of:

forming a parallel array of active area liners composed of silicon oxide, then depositing a conformal first silicon nitride liner on the sidewalls of the isolation trenches thereby narrowing the isolation trenches and above the isolation trench mask.

5. The method of claim 2 including, before forming the isolation diffusion region, performing the steps of:

filling the isolation trenches with sacrificial silicon oxide, planarizing the sacrificial silicon oxide, and forming a blanket silicon nitride layer over the structure, forming a silicon oxide masking layer on the blanket silicon nitride layer, and etching a parallel array of shallow trenches through the silicon oxide masking layer, thereby forming silicon oxide stripes orthogonal to the active area stripes by etching through the silicon oxide masking layer.

6. The method of claim 5 including, before forming the isolation diffusion region, performing the step of doping the diffusion isolation regions between the deep trenches.

7. The method of claim 5 including, before forming the isolation diffusion region performing the steps of:

forming spacers on the sidewalls of the parallel array of shallow trenches thereby forming narrowed shallow trenches, forming windows to diffusion isolation regions in the substrate and to the gate conductors and by etching through the narrowed shallow trenches, stripping the silicon oxide masking layer and the spacers, and doping the diffusion isolation regions through the widows.

8. The method of claim 6 including, before forming the isolation diffusion region, performing the step of forming a blanket silicon nitride protective layer and forming a planarized silicon oxide layer thereover.

9. The method of claim 7 including, before forming the isolation diffusion region, performing the step of forming a blanket silicon nitride protective layer and forming a planarized silicon oxide layer thereover.

10. A method of forming a vertical transistor memory cell structure with back-to-back FET cells formed in a planar semiconductor substrate with a doped plate region in the substrate below a counterdoped well region, deep trenches formed therein extending into the substrate through the well region and into the plate region; each deep trench having side walls and a bottom with bilateral outdiffusion strap regions formed in the well region juxtaposed with the deep trenches midway up the sidewalls and a plate region formed in the substrate from the lower levels of the deep trench to below the deep trenches; a collar formed along middle levels of the sidewalls of the deep trench from a lower portion of the strap regions down towards the plate region of the substrate and a node dielectric covering lower sidewalls and the bottom of the deep trenches; the deep trenches having capacitor nodes formed in the bottom of the deep trenches and trench top dielectric layers formed above the capacitor nodes; the capacitor nodes being in electrical contact with the bilateral outdiffusion strap regions; a gate oxide layer formed on the sidewalls of the deep trench above the capacitor nodes and a gate conductor formed above the trench top dielectric layer and inside the gate oxide layer in the deep trenches; comprising the step of:

forming an isolation diffusion region in the substrate between the back-to-back cells separating the confronting outdiffusion strap regions, whereby fields surrounding the outdiffusion/strap regions are separated by the isolation diffusion region.

11. The method of claim 10 including, before forming the isolation diffusion region, performing the steps of:

forming an isolation trench masking layer with openings between rows of deep trenches, and then etching through the openings in the isolation trench masking layer to form isolation trenches between rows of deep trenches.

12. The method of claim 10 including, before forming the isolation diffusion region, performing the steps of:

forming a parallel array of active area liners composed of silicon oxide, and then depositing a conformal first silicon nitride liner on the sidewalls of the isolation trenches thereby narrowing the isolation trenches and above other surfaces of the structure.

13. The method of claim 10 including, before forming the isolation diffusion region, performing the steps of:

forming a parallel array of active area liners composed of silicon oxide, and then depositing a conformal first silicon nitride liner on the sidewalls of the isolation trenches thereby narrowing the isolation trenches and depositing the conformal first silicon nitride liner above the isolation trench mask.

14. The method of claim 12 including, before forming the isolation diffusion region, performing the steps of:

filling the isolation trenches with sacrificial silicon oxide, planarizing the sacrificial silicon oxide, and forming a blanket silicon nitride layer over the structure forming a silicon oxide masking layer over the blanket silicon nitride layer, and etching a parallel array of shallow trenches through the silicon oxide masking layer, thereby forming silicon oxide stripes orthogonal to the active area stripes by etching through the silicon oxide masking layer.

15. The method of claim 14 including, before forming the isolation diffusion region, performing the step of doping the diffusion isolation regions between the deep trenches.

16. The method of claim 14 including, before forming the isolation diffusion region, performing the steps of:

forming spacers on the sidewalls of the parallel array of shallow trenches thereby forming narrowed shallow trenches, forming windows to a diffusion isolation regions in the substrate and to the gate conductors and by etching through the narrowed shallow trenches, stripping the silicon oxide masking layer and the spacers, and doping the diffusion isolation regions through the widows.

17. The method of claim 14 including, before forming the isolation diffusion region, performing the steps of:

forming a blanket silicon nitride protective layer, and forming a planarized silicon oxide layer thereover.

18. A vertical transistor memory cell structure comprising:

back-to-back FET cells formed in a planar semiconductor substrate with a doped plate region in the substrate below a counterdoped well region, deep trenches formed extending into the planar semiconductor substrate through the well region and into the plate region, each deep trench having side walls and a bottom, bilateral outdiffusion strap regions formed in the well region juxtaposed with the deep trenches midway up the sidewalls, a plate region formed in the substrate extending deeper into the substrate from lower levels of the deep trench to below the deep trenches, and an isolation diffusion region formed in the substrate between the back-to-back cell separating the confronting outdiffusion strap regions, whereby fields surrounding the outdiffusion regions are separated by the isolation diffusion region.

19. The vertical transistor memory cell structure of claim 18 including:

a collar formed along middle levels of the sidewalls of the deep trench extending deeper into the substrate from a lower portion of the strap regions towards the plate region of the substrate, and a node dielectric covering lower sidewalls and the bottom of the deep trenches.

20. The vertical transistor memory cell structure of claim 18 including:

capacitor nodes formed in the bottom of the deep trenches inside the node dielectric in electrical contact with the bilateral ontdiffusion strap regions, trench top dielectric layers formed above the capacitor nodes, a gate oxide layer formed on the sidewalls of the deep trench above the capacitor nodes, and a gate conductor formed above the trench top dielectric layer and inside the gate oxide layer in the deep trenches.

* * * * *